United States Patent
Mörsberger et al.

(10) Patent No.: US 6,651,209 B1
(45) Date of Patent: Nov. 18, 2003

(54) PARALLEL TURBO CODER IMPLEMENTATION

(75) Inventors: Gerd Mörsberger, Johannesstrasse (DE); Georg Sporlein, Bahnhofstrasse (DE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 356 days.

(21) Appl. No.: 09/660,290

(22) Filed: Sep. 12, 2000

(30) Foreign Application Priority Data

Sep. 15, 1999 (EP) ............................................ 99117945

(51) Int. Cl.⁷ ..................... H03M 13/00; H03M 13/03; H04L 23/02; H04B 7/216
(52) U.S. Cl. ..................... 714/755; 714/786; 714/792; 375/265; 375/295; 370/342
(58) Field of Search ................................. 714/755, 786, 714/792, 761; 375/265, 295; 370/342

(56) References Cited

U.S. PATENT DOCUMENTS

| | | | | |
|---|---|---|---|---|
| 6,023,783 A | * | 2/2000 | Divsalar et al. ............ | 714/792 |
| 6,038,695 A | * | 3/2000 | Pehkonen ................... | 714/786 |
| 6,289,486 B1 | * | 9/2001 | Lee et al. ................... | 714/788 |
| 6,304,991 B1 | * | 10/2001 | Rowitch et al. ............ | 714/755 |
| 6,366,624 B1 | * | 4/2002 | Balachandran et al. ..... | 375/341 |
| 6,374,386 B1 | * | 4/2002 | Kim et al. .................. | 714/786 |
| 6,397,367 B1 | * | 5/2002 | Park et al. .................. | 714/786 |

OTHER PUBLICATIONS

Wicker, Stephen B. Error Control Systems for digital communications and storage, 1995,Prentice Hall ,Inc. pp. 264–271.*

Gupta,S. and Hmimy,A. Performance of turbo–codes for WCDMA Ssytems in Frequency Selective Fading Channels, IEEE, pp. 1459–1463.*

Duman, T. and Kurtas,E. Performance of Turbo Codes Over Magnetic Recording Channels,IEEE, pp. 806–810.*

Hong,S. and Stark,W. VLSI Design and Implementation of Low–Complexity Adaptive Turbo–code encoder and decoder for Wireless Mobile Communication Applications, IEEE, pp. 233–242.*

*Electronics Letters*, vol. 32, No. 11, May 23, 1996, pp. 98–983, XP000599120, S. Benedetto et al., "Canonical Strcture for Systematic Rate k/n Convolutional Encoders and Its Application to Turbo Codes".

IEEE *Transactions on Information Theory*, vol. 42. No. 2., Mar. 1996, pp. 409–428, XP002057508, S. Benedetto et al., "Unveling Turbo Codes: Some Results in Parallel Concatenated Coding Schemes".

* cited by examiner

*Primary Examiner*—David Ton
*Assistant Examiner*—Anthony T. Whittington
(74) *Attorney, Agent, or Firm*—Nixon & Vanderhye, P.C.

(57) ABSTRACT

A turbo coder block having a parallelization of degree n achieves increased processing speed. Each parallelized turbo coder block includes a first storage unit to store n samples of an input signal and a second storage unit to store n samples of at least one output signal of the parallelized turbo coding block. The parallelized turbo coder block further includes a bank of n delay units and is adapted to parallel process n samples of the input signal such that two delay units of the bank directly receive subsets of the n samples of the input signal, and an output signal of one delay unit is supplied to two delay units in the parallelized turbo coder block.

12 Claims, 9 Drawing Sheets

8 BIT PARALLEL TURBO BLOCK- INPUT PART

8 BIT PARALLEL TURBO CODING BLOCK- PART FOR OUTPUTS Q

PARALLEL TURBO CODER IMPLEMENTATION

FIELD OF INVENTION

The present invention relates to a turbo coder implementation, and in particular the present invention relates to a parallelization of a turbo coder implementation.

BACKGROUND ART

The base band part of a transmitter in a telecommunication system usually includes together with other parts a general encoder for bits to be transmitted. The encoder adds redundant information to an incoming data stream with bit size K. Thereby, the number of bits is increased by a factor of 1/r, depending on the coder rate r. Currently, coder rates of ½ and ⅓ are commonly used, although other rates are possible as well. As result for each block of K uncoded bits the encoder outputs a block of K/r coded bits.

At a receiving side for the data stream in the telecommunication system the original data stream is recalculated from the coded data block in a receiver even in case some bits get corrupted during transmission over, e.g., the air interface.

Recently, turbo coders have been introduced for the purpose of error control for the transmission of telecommunication data. In general, turbo coding involves applying two or more component codes to different interleaved versions of the same information sequence prior to transmission. As turbo coding is well known in the art, e.g., Berrou et al., "Near Shannon Limit Error—Correcting Coder and Decoder: Turbo-Codes", IEEE International Communication Conference, pp. 1064–1070, May 1993 and Sklar, "A Primer on Turbo Code Concepts", IEEE Communications Magazine, pp. 94–102, December 1997, no further details will be given here and the stated references are incorporated herein by reference.

An example for a turbo coder is shown in FIG. 8. As shown in FIG. 8, the turbo encoder consists of two turbo coder blocks TCB1, TCB2 being identical in structure. The difference for the two turbo coder blocks is that one receives the bits of the input block in an unchanged order, whereas the other receives the input bits in an interleaved order. For each input bit, e.g., three output bits are generated at the output 0, 1, and 2, respectively.

As shown in FIG. 8, the turbo coder block TCB1 comprises a first XOR gate 100 at its input and a second XOR gate 102 at its output. In between there are arranged three delay units 104 to 108 for the delay of the respective input bits. Similarly, the turbo coder block TCB2 comprises a third XOR gate 110 at its input and a fourth XOR gate 112 at its output. In between, there are provided three delay units 114 to 118 that delay the respective input bits.

As also shown in FIG. 8, the input signal to the turbo coder is supplied directly to the turbo coder block 1 while it is supplied via an interleaver 120 to the second turbo coder block TCB2. For the output 0 the input signal is also directly forwarded without any modification.

Operatively, parameters for the turbo coder shown in FIG. 8 are the number of delay units in each turbo coder block and further the supply of input signals to the different XOR gates 100, 102, 110, and 112.

A straightforward implementation of the turbo coder shown in FIG. 8 relies on the use of delay units as well as input and output registers (not shown in FIG. 8) such that turbo coding is done in a bitwise manner. Here, all delay units work with the same system clock so that the output of a delay unit represents the input thereof at the previous clock cycle.

While the straightforward implementation of the turbo coder using the delay units in a serial manner does not require many registers and XOR gates the main disadvantage is that turbo coding is executed in a serial way. This means that only one bit is coded per cycle of the system clock. In conclusion, for cases where high bit rates are necessary, the system clock frequency is to be increased to very high values.

If, e.g., 1200 channels are to be encoded each being related to a voice channel with 100 bits in a time period of 1 msec, the necessary system clock frequency is 120 Mhz.

Here, it would be very difficult to implement a related turbo coder, e.g., using ASIC or FPGA technology.

While one solution would be to implement a dedicated turbo coder for each channel, this would require a complicated handling of input and output bit streams since different channels still must be coded in parallel. This would lead to a very complex control logic to supply the right input at the correct time to the right turbo coder. Further, the outputs of the different turbo coders also would have to be handled in the same complicated way.

SUMMARY OF INVENTION

In view of the above, the object of the invention is to increase the processing speed of turbo coder blocks.

According to the present invention this object is achieved through a parallel realization of turbo coders.

Heretofore, the structure of a turbo coder block is initially described using a general formalized description which then forms the basis for a parallelization of the turbo coder block.

In particular, input samples to the turbo coder block are interpreted as elements of a parallel input vector of dimension n, where n is the degree of parallelization.

The general formalized description of the turbo coder block is then used to derive a mapping of this parallel input vector into at least one parallel output vector.

In more detail, an internal state variable substitution process is applied to each internal state variable of the general formalized description wherein the representation of the internal state variables is scanned for maximum time index elements which are then substituted through carrying out backward time index transitions using previously determined time index substituted representations of the internal state variables. These substitution steps are repeated until the representation of each internal state variable is only dependent on input vector elements and values for internal state variables of the turbo coder being delayed according to the degree of parallelization.

Further, the substitution process is carried out as well for each element of each parallel output vector. Again the representation of each vector element in each output vector is scanned for internal state variables having maximum time index and then a backward time index transition in the representation of the vector element is determined recursively until the representation of the vector element is only dependent on input vector elements and values for internal state variables being delayed according to the degree of parallelization.

Therefore, only one parallelized turbo coder block is necessary instead of many serial turbo coders to achieve an increased processing speed. This leads to the decisive advantage that no complicated input and output control for a plurality of turbo coder blocks is necessary.

E.g., for a four bit parallel turbo coder block the resulting system clock frequency in the example mentioned above lies in the range of 30 MHz and therefore may be easily realized using FPGA or ASIC technology. Therefore, the parallelized turbo coder blocks and the turbo coder derived therefrom achieve a speed-up over the serial turbo coder according to the degree of parallelization so that pre-defined specification may be met using FPGA or ASIC technology-based implementations. Thus, the parallelized turbo coder block may form the basis for complicated telecommunication systems having low processing delay in the base band part without complicated handling of different channels at the same time.

Further, the parallelized turbo coder block and related turbo coder require only a minimum additional surplus in logic gates and registers when being compared to the serial turbo coder.

Still further, when processing blocks in front and subsequent to the turbo coder also support a parallel processing manner, the complete encoder block in total requires less logic and registers than the encoder block with a serial turbo coder and some additional converters (parallel to serial and vice versa).

According to another preferred embodiment, a computer program product is stored in a computer memory and includes software code portions for performing the steps according to the inventive parallelization method when being run on a computer. Preferably, the software code portions are of the VHDL type.

The present invention permits fast development and modification of parallel turbo coder design with decreased number of development cycles and increased flexibility with respect to the mapping of the design to different hardware technologies, e.g., ASIC or FPGA, respectively.

BRIEF DESCRIPTION OF DRAWINGS

In the following, preferred embodiments of the present invention will be described with reference to the enclosed drawings in which.

DESCRIPTION OF PREFERRED EMBODIMENTS

In the following, preferred embodiments of the present invention will be described with reference to FIGS. 1 to 7.

Figure 1:
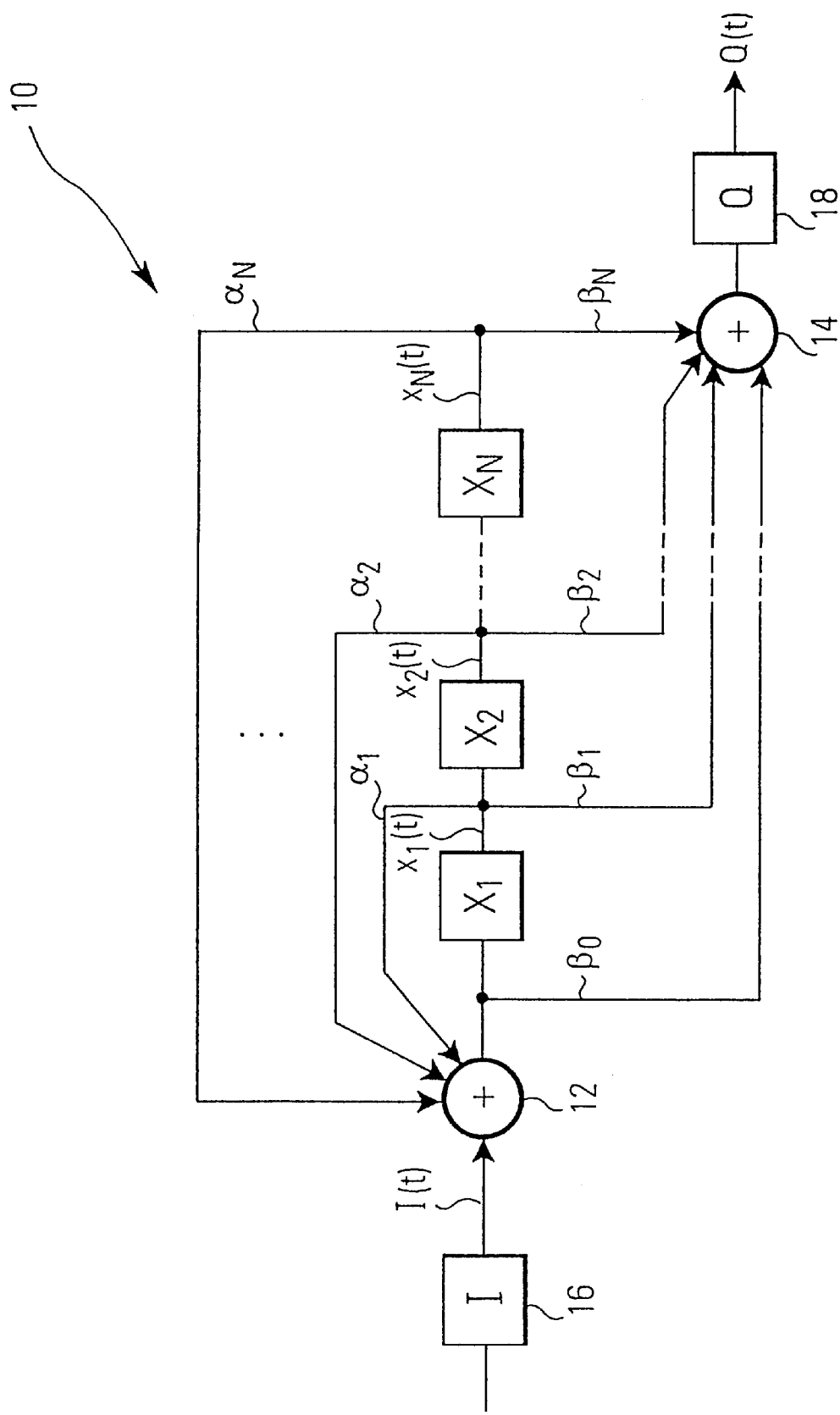
FIG. 1 shows a circuit diagram of a turbo coder block having one output.
Figure 2:
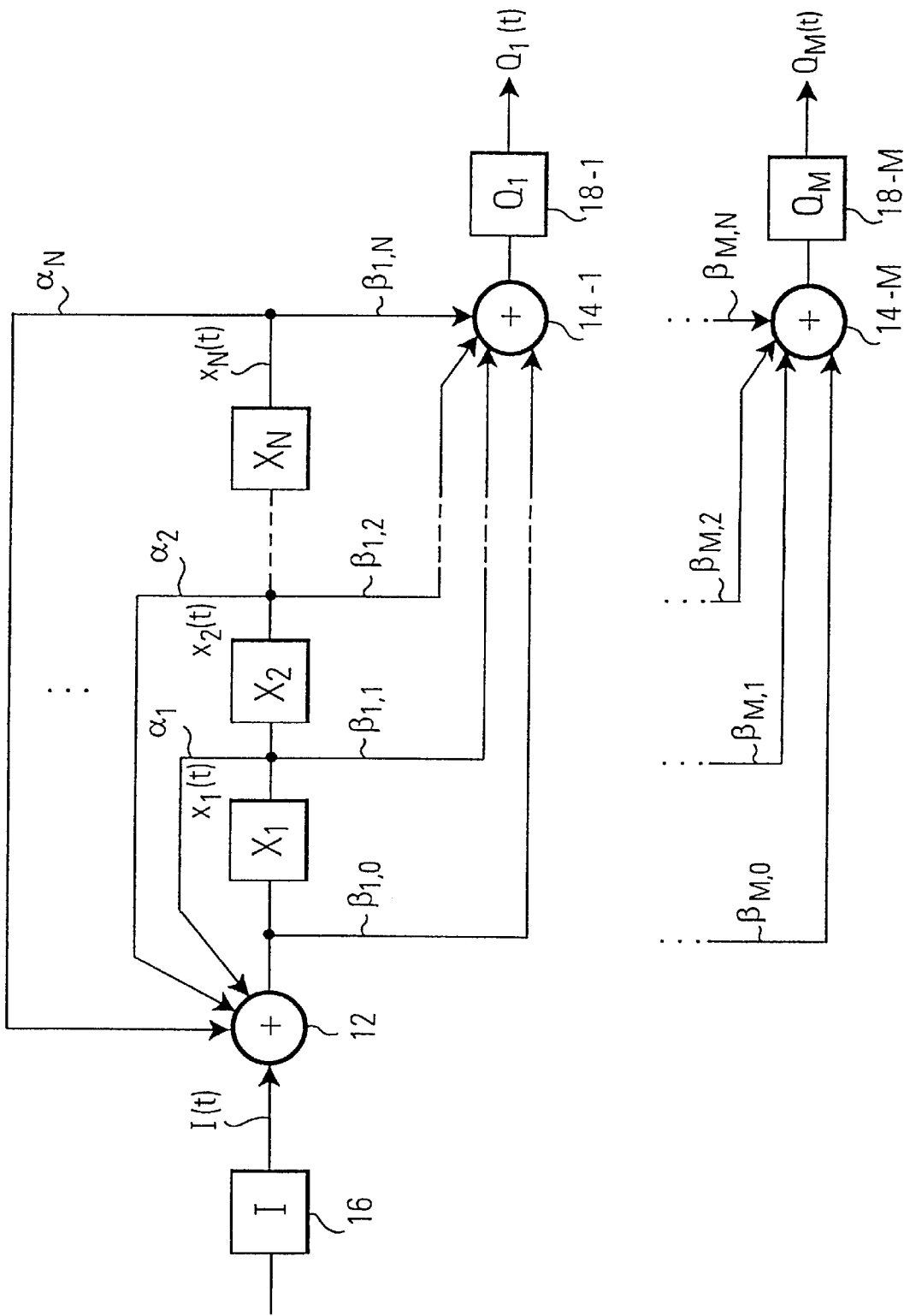
FIG. 2 shows a circuit diagram of a turbo coder block having a plurality of outputs.

In particular, initially a formal description of a turbo coder block as shown in FIGS. 1 and 2 will be given as basis for the description of the parallelization method according to the present invention.

Then, it will be described with reference to FIG. 3 how a time sequential stream of data inputs may be mapped into a parallel input vector to be handled in the parallelized turbo coder block and how the parallel output vector of this parallelized turbo coder block may again be mapped into a time sequential stream of data outputs.

Subsequent hereto different examples for a parallel implementation of turbo coder blocks using the parallelization method according to the present invention will be given with reference to FIGS. 4 to 7.

1. Turbo Coder Block with a Serial Implementation, General Description

FIG. 1 shows a circuit diagram of a turbo coder block using a serial implementation.

As shown in FIG. 1, the turbo coder block comprises N delay units, $X_1, X_2, \ldots X_N$ such as flip flops, e.g.. The output signals of the delay units $X_j, X_2, \ldots X_N$ will be referred to as $x_1(t), x_2(t) \ldots x_N(t)$, respectively, where t denotes the integer time index. At the input of the first delay unit $X_1$ there is provided an input XOR gate 12 and at the output of the last delay unit $X_n$, there is provided an output XOR gate 14.

As also shown in FIG. 1, an input signal I(t) supplied via an input delay unit 16 and the output signal of the output XOR gate 14 is forwarded via an output delay unit 18.

As also shown in FIG. 1, the output signals $x_1(t), x_2(t), \ldots, x_N(+)$ can be supplied to the input XOR gate 12 via connections $\alpha_1, \alpha_2, \ldots, \alpha_N$. Also, the input signals to the delay units can be supplied to the output XOR gate 14 via connections $\beta_0, \beta_1, \ldots, \beta_{N-1}$. Further, the output of the delay unit $X_N$ is supplied to the output XOR gate 14 via a connection $\beta_N$.

By formally assigning a value of 0 or 1 to each of the connections $\alpha_1, \alpha_2, \ldots, \alpha_N$ and further to each of the connections $\beta_0, \beta_1, \ldots, \beta_N$ it is possible to describe any serial turbo coder block implementation with N delay units according to:

$$x_1(t) = I(t-1) \oplus \alpha_1 \cdot x_1(t-1) \oplus \alpha_2 \cdot x_2(t-1) \oplus \ldots \oplus \alpha_N \cdot x_N(t-1) \quad (1.\mathrm{x}_1)$$
$$\alpha_i \varepsilon \{0, 1\}$$
$$x_2(t) = x_1(t-1) \quad (1.\mathrm{x}_2)$$
$$\vdots \quad \vdots \quad (1.\mathrm{x}_N)$$
$$x_N(t) = x_{N-1}(t-1)$$

-continued $$Q(t) = \beta_0 \cdot [I(t-1) \oplus \alpha_1 \cdot x_1(t-1) \\ \oplus \alpha_2 \cdot x_2(t-1) \\ \oplus \ldots \oplus \alpha_N \cdot x_N(t-1)] \oplus \\ \beta_1 \cdot x_1(t-1) \oplus \beta_2 \cdot x_2(t-1) \oplus \ldots \oplus \beta_N \cdot x_N(t-1)$$

$$= \beta_0 \cdot I(t-1) \oplus \\ \beta_0 \cdot \alpha_1 \cdot x_1(t-1) \oplus \quad \beta_1 \cdot x_1(t-1) \oplus \\ \vdots \\ \beta_0 \cdot \alpha_N \cdot x_N(t-1) \oplus \quad \beta_N \cdot x_N(t-1)$$

$$= \beta_0 \cdot I(t-1) \oplus \\ x_1(t-1) \cdot [\beta_0 \cdot \alpha_1 \oplus \beta_1] \quad \oplus \\ \vdots \\ x_N(t-1) \cdot [\beta_0 \cdot \alpha_N \oplus \beta_N]$$

(1.Q)

$$\beta_i \, \varepsilon \, \{0, 1\}$$

As shown in FIG. 2, the general description given above for a turbo coder block having a single output may be generalized to a turbo coder block using a serial implementation and having a plurality of outputs.

As FIG. 1 also FIG. 2 shows delay units $X_1, X_2, \ldots, X_N$ of which the output signals are again referred to as $x_1(t), x_2(t), \ldots, x_N(t)$. The output signals $x_1(t), x_2(t), x_N(t)$ of each delay unit $X_1, X_2, \ldots, X_N$ are supplied to the input XOR gate 12 via connections $\alpha_1, \alpha_2, \ldots, \alpha_N$ already shown in FIG. 1. Also, the input data stream is supplied to the input XOR gate 12 via the input delay unit 16.

The serial turbo coder block shown in FIG. 2 differs over the previously discussed turbo coder block in that a plurality of outputs $Q_1(t), \ldots, Q_M(t)$ is provided for. As shown in FIG. 2, for each output there is provided a related output XOR gate 14-1, ..., 14-M. At the output of each such output XOR gate 14-1, ..., 14-M there is connected a related output delay unit 18-1, ..., 18-M.

As also shown in FIG. 2, each input to the delay units $X_1, X_2, \ldots, X_N$ can be supplied to the first output XOR gate 14-1 via connections $\beta_{1,0}, \beta_{1,1}, \beta_{1,2}, \beta_{1,N-1}$, further to the second output XOR gate 14-2 via connections $\beta_{2,0}, \beta_{2,1}, \beta_{2,2}, \beta_{2,N-1}$, etc.. Further, the output of the last delay unit $X_N$ is supplied via a connection $\beta_{1,N}$ to the first output XOR gate 14-1, via a connection $\beta_{2,N}$ to the second output XOR gate 14-2, etc.. Finally, the output signal of each output XOR gate is delayed to derive the turbo coder block output signals $Q_1(t), \ldots, Q_M(t)$.

The formal description of the turbo coder shown in FIG. 2 differs over the previously discussed in that for each output $Q_1(t), \ldots Q_M(t)$ a related output representation is generalized to:

$$Q_j(t) = \beta_{j0} \cdot I(t-1) \oplus \\ x_1(t-1) \cdot [\beta_{j0} \cdot \alpha_1 \oplus \beta_{j1}] \oplus \\ \vdots \\ x_N(t-1) \cdot [\beta_{j0} \cdot \alpha_N \oplus \beta_{jN}]$$

(1.Q)

$$\beta_{ij} \, \varepsilon \, \{0, 1\} \\ j \varepsilon \, [1, \ldots, M]$$

The above formal representations of a turbo coder block in serial implementation having either one or a plurality of outputs will serve as a basis of the description of the parallelization method according to the present invention.

However, before the parallelization method according to the present invention will be described in the following, initially a mapping of a serial data input stream into a parallel input vector and also the mapping of a parallel output vector back into a serial data output stream will be described with reference to FIG. 3.

2. Turbo Coder Block Using a Parallel Implementation of Degree n

Figure 3:
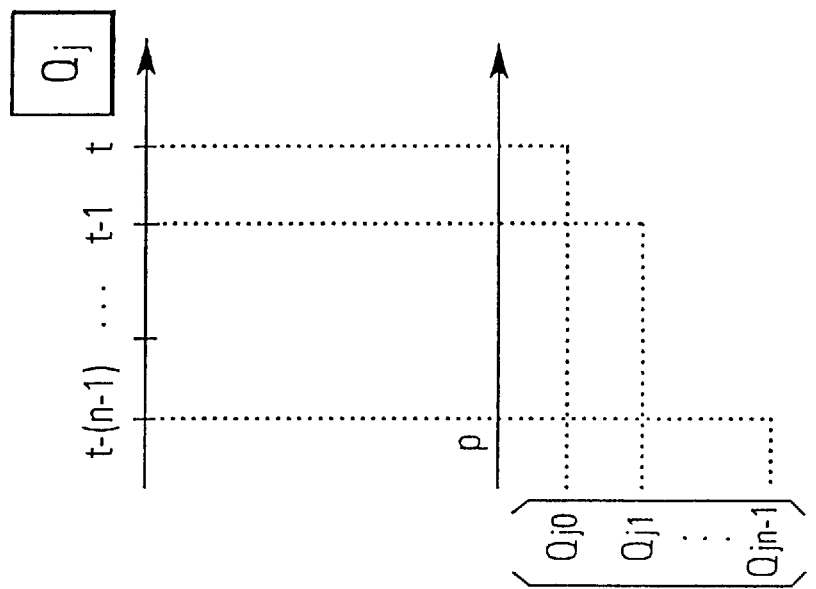
FIG. 3 shows the mapping of a time sequential stream of data inputs into a parallel input vector and the mapping of a parallel output vector into a time sequential stream of data outputs.
Figure 3:
Figure 3:
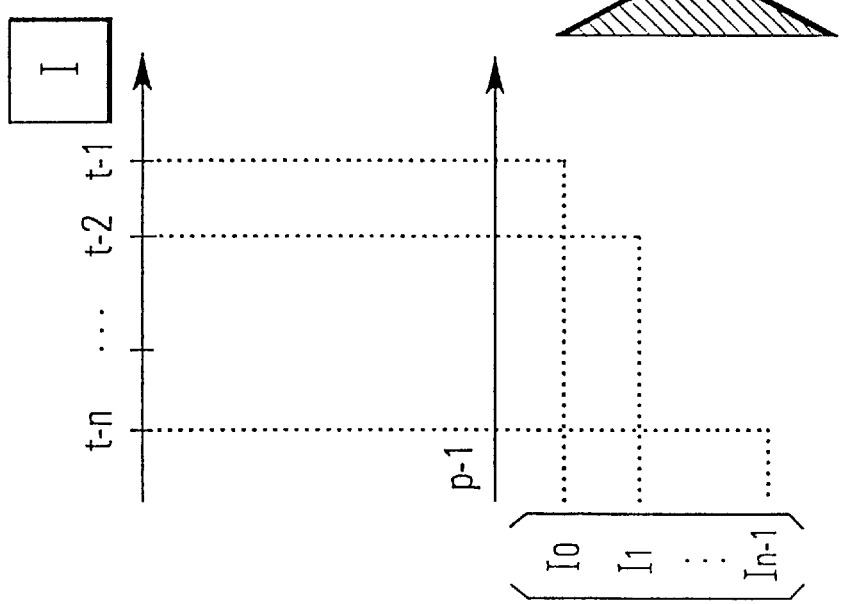

On the upper left side, FIG. 3 shows a time sequence according to a serial data input stream. Similarly, FIG. 3 shows in the upper right part a time sequence according to a serial output stream.

As shown in FIG. 3, a parallel input vector I0, I1, In−1 may be derived from a series of data input values I(t−1), I(t−2), ..., I(t−n) according to:

$$I(t-1) = I0(p-1) \\ I(t-2) = I1(p-1) \\ I(t-n) = In-1(p-1)$$

Assuming that the parallel input vector shown in FIG. 3 derived from the serial data input stream is processed in a parallel turbo coder block to be decribed in the following, one arrives at a parallel output vector $Q_j 0, \ldots, Q_j n-1$.

As shown in FIG. 3, this parallel output vector may then be mapped back to a serial data output stream $Q_j(t), \ldots, Q_j(t-(n-1))$ according to:

$$Q_j(t) = Q_j 0(p) \\ Q_j(t-1) = Q_j 1(p) \\ \vdots \\ Q_j(t-(n-1)) = Q_j n-1(p)$$

$$j \varepsilon \, [1, \ldots, M]$$

2.1 General Outline of Parallelization

According to the present invention there are used different time scales in the serial domain and the parallel domain. In other words, a set of n serial data inputs in the serial time domain corresponds to a parallel input vector that is processed in parallel according to one clock cycle in the parallel time domain p.

In conclusion, the resulting parallel system clock is n times slower than the serial system clock assuming that the same amount of data is to be processed. Therefore, the serial time expression (t−1) may be replaced by the parallel time expression (p−1) and a sequence of n serial time inputs is re-written as a single parallel input vector, one parallel clock cycle earlier (p−1). Similarly, the series of outputs is re-written as parallel output vector for the current parallel cycle (p).

Using the general description of a turbo coder block according to FIGS. 1 and 2 and further the mapping of the serial data input stream into a parallel input vector and the reverse mapping of the parallel output vector into a serial output data stream the approach according to the present invention relies on the supply of a parallel input vector having n serial data input items to a parallelized turbo coding block and the calculation of M output vectors each comprising n output data items therein.

The n elements of the output vector(s) depend only on values of the internal delay units $X_1, \ldots, X_N$ at n system clocks of the serial turbo coder block implementation earlier—which corresponds to only one cycle in the parallelized turbo coder block—and further on all input data items during these n cycles summarized in the parallel input vector.

As will be shown in the following, the approach underlying the present invention relies on the determination of equations representing the output elements of the parallel output vector and the output values of the internal delay units of the parallel turbo coder block for the next parallel cycle in dependence of output values of the internal delay units of the parallel turbo coder block and the parallel input vector for the previous parallel cycle.

According to the serial representation (see eq. (1.Q)) each output value of a serially implemented turbo coding block at time t is calculated from output values of the delay unit $X_1, \ldots, X_N$ at time t−1 and the input data item at time t−1.

By replacing all output values of the internal delay units with values at one system clock cycle for the serial implementation earlier and through repeating these replacement steps in a recursive manner until only output values at n serial system clock cycles earlier are left there may be derived equations for the parallel calculation of the output results over n serial cycles or equivalently one parallel cycle.

In other words, these equations form the basis of the parallelized turbo coder blocks as n serial clock cycles represent one parallel clock cycle.

2.2 Backward Time Index Substitution for First Internal State:

In preparing the recursive substitution process mentioned above one may use the representation for the output of the first delay unit $X_1$ (c.f. eq. (1.$x_1$))

$$x_1(t) = I(t-1) \oplus \alpha_1 \cdot x_1(t-1) \oplus$$
$$\alpha_2 \cdot x_2(t-1) \oplus \ldots \oplus$$
$$\alpha_N \cdot x_N(t-1)$$

which is also referred to as first internal state in the following to express this internal state for the serial clock cycles t−1, . . . , t−(n−1) according to:

$$x_1(t-1) = I(t-2) \oplus \alpha_1 \cdot x_1(t-2) \oplus \quad (2.x_1.1)$$
$$a_2 \cdot x_2(t-2) \oplus \ldots \oplus$$
$$\alpha_N \cdot x_N(t-2)$$

$$\vdots \quad (2.x_1.n-1)$$
$$x_1(t-(n-1)) = I(t-n) \oplus \alpha_1 \cdot x_1(t-n) \oplus$$
$$\alpha_2 \cdot x_2(t-n) \oplus \ldots \oplus$$
$$\alpha_N \cdot x_N(t-n)$$

2.3 Backward time index substitution for further internal states (i=2, . . . , N):

Further, the representation for the outputs of the additional delay units $X_2, \ldots, X_N$ (see eq. (1.$x_2$), . . . , (1.$x_N$))

$$x_i(t) = x_{i-1}(t-1)$$

which are also referred to as further internal states in the following may be used to express these internal states for the serial clock cycles t−1, . . . , t−(n−1) according to:

$$x_i(t-1) = x_{i-1}(t-2) \quad (2.x_i.1)$$
$$\vdots \quad (2.x_i.n-1)$$
$$x_i(t-(n-1)) = x_{i-1}(t-n)$$

2.4 Backward time index substitution for output vector elements:

Still further, the representation for the at least one output of the turbo coder block (c.f. eq. (1.Q))

$$Q_j(t) = \beta_{j0} \cdot I(t-1) \oplus \quad (2.Q.0)$$
$$x_1(t-1) \cdot [\beta_{j0} \cdot \alpha_1 \oplus \beta_{j1}] \oplus$$
$$\vdots$$
$$x_N(t-1) \cdot [\beta_{j0} \cdot \alpha_N \oplus \beta_{jN}]$$

may be used to express this output for the serial clock cycles t−1, . . . . t−(n−1) according to:

$$Q_j(t-1) = \beta_{j0} \cdot I(t-2) \oplus \quad (2.Q.1)$$
$$x_1(t-2) \cdot [\beta_{j0} \cdot \alpha_1 \oplus \beta_{j1}] \oplus$$
$$\vdots$$
$$x_N(t-2) \cdot [\beta_{j0} \cdot \alpha_N \oplus \beta_{jN}]$$

$$\vdots \quad (2.Q.n-1)$$
$$Q_j(t-(n-1)) =$$
$$\beta_{j0} \cdot I(t-n) \oplus$$
$$x_1(t-n) \cdot [\beta_{j0} \cdot \alpha_1 \oplus \beta_{j1}] \oplus$$
$$\vdots$$
$$x_N(t-n) \cdot [\beta_{j0} \cdot \alpha_N \oplus \beta_{jN}]$$

2.5 Parallelization Through Recursive Backward Time Index Transition Steps:

2.5.1 Object

As already outlined above the object underlying the parallelization process according to the present invention is to express the elements of each parallel output vector—one per output 1, . . . , M shown in FIG. 2—as a function of a series of n serial data input items and the internal states one parallel cycle—equivalent to n serial cycles—before the current parallel cycle:

$$Q_j(t-i) = f[I(t-1), \ldots, I(t-n); x_1(t-n), \ldots, x_N(t-n)] \quad (2.Q_i)$$
$$\text{for } i \varepsilon [0, \ldots, n-1]$$
$$j \varepsilon [1, \ldots, M]$$

$$\Leftrightarrow$$

$$Q_{ji}(p) = f[I0(p-1), \ldots, In-1(p-1); x_1(p-1), \ldots, x_N(p-1)].$$

2.5.2 Recursive Time Index Transition Steps

Firstly, to achieve this goal all internal states are parallelized. For all internal states $x_1(t), \ldots, x_N(t)$ initially a maximum time index to be used in the representation of this internal state is set to t−1 according to a serial description of operation.

Then the representations of all internal states are considered and each is recursively scanned to substitute internal state variables dependent on the current maximum time index by a formula expressing the same internal state in dependence of a time index preceeding this current maximum time index using one of equations (2) listed above.

Therefore the representation of the considered internal state is modified in a way that a transition is made from the current maximum time index to the time index preceeding the current maximum time index. This transition will be referred to as backward time index transition in the following. After the backward time index transition is achieved for all internal state variables depending on the current maximum time index the current maximum time index is decreased by a value of 1.

This recursive repetition of this process continues until the maximum time index reaches a value of t−n. The reason for this is that at this point the considered internal state at cycle t (p) is described in dependency only of internal states at time t−n (p−1) and serial input data items I(t−1), . . . I(t−n).

Secondly, all elements in each of the output vectors are parallelized by carrying out again backward time index transitions in a recursive manner as described above for the internal states.

Further, it should be mentioned that at intermediate stages between the recursive time index transition steps, at modification of the current maximum time index, the respective representations of internal states and elements of output vectors may be simplified using the relation (a⊕a⊕o=b). In other words double terms (a⊕a) may be cancelled in the respective representations.

The recursive parallelization of the serial turbo coder block in the most general form as shown in FIG. 2 may be summarized as follows:

```
procedure recursive_parallelization(n)
int i, j, k;
{
    /* parallelization of internal states */
    for( k=1; k<=N; k++ )
    {
        /* consider internal state x_k(t) */
        t_max = t-1;
        while( tmax > t-n )
        {
            scan representation of internal state X_k(t)
            for internal states with maximum time index
            t_max;
            for( all internal states with maximum time
            index )
            {
                execute backward time index transition
                from t_max to t_max-1 through state variable
                substitution using eq. (2) above;
            }
            cancel double terms in representation of
            internal state x_k(t);
            t_max = t_max-1;
        }
    }
    /* parallelization of output variables */
    for( j=1; j<=M; j++ )
    {
        for( i=0; i<=n-2; i++ )
        {
            /* consider output vector element Q_j(t-i) */
            t_max = t-i-1;
            while( tmax > t-n )
            {
                scan representation of Q_j(t-i) for
                internal states with maximum time index;
                for( all internal states with maximum time
                index )
                {
                    execute backward time index
                    transition from t_max to t_max-1
                    through state variable substitution
                    using eq. (2) above;
                }
                cancel double terms in representation of
                Q_j(t-i);
                t_max = t_max-1;
            }
        }
    }
} /* end procedure */
```

To illustrate the application of the parallelization approach generally described above, in the following, this parallelization process will be explained in more detail with reference to specific examples.

As will be shown in the following each parallelized turbo coder block comprises a storage unit, e.g., a first group of flip flops I0, . . . , I7 to store n samples I(t−1), . . . , I(t−n) of the input signal I(t) for further supply to the parallelized turbo coding block and at least one storage unit, e.g., a second group of flip flops Q0, . . . , Q7 to store n samples $Q_j(t), \ldots, Q_j(t-(n-1))$ of the at least one output signal $Q_j(t)$, j=1, . . . , M, of the parallelized turbo coding block.

Further, the parallelized turbo coder block comprises a bank of n delay units $X_1, \ldots, X_N$ and is adapted to a parallel processing of n samples of the input signal I(t) such that at least two delay units $X_1, \ldots, X_N$ of the bank directly receive subsets of the n samples I(t−1), . . . , I(t−n) of the input signal I(t) and an output signal of at least one delay unit $X_1, \ldots, X_N$ in the parallelized turbo coder block is supplied to at least two delay units in the parallelized turbo coder block.

Figure 4:
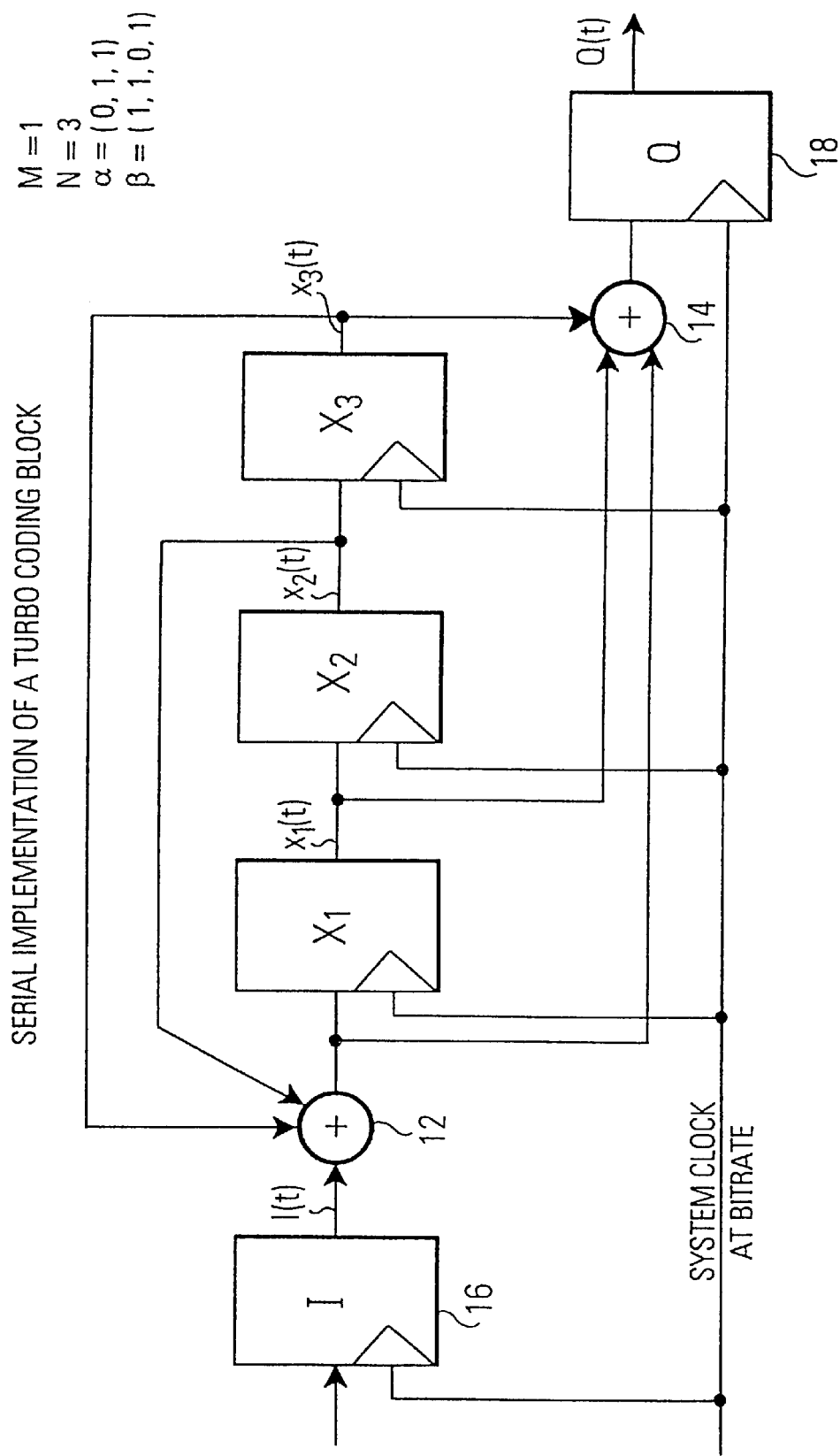
FIG. 4 shows a circuit diagram of a serial implementation of a specific turbo coder block.
Figure 8:
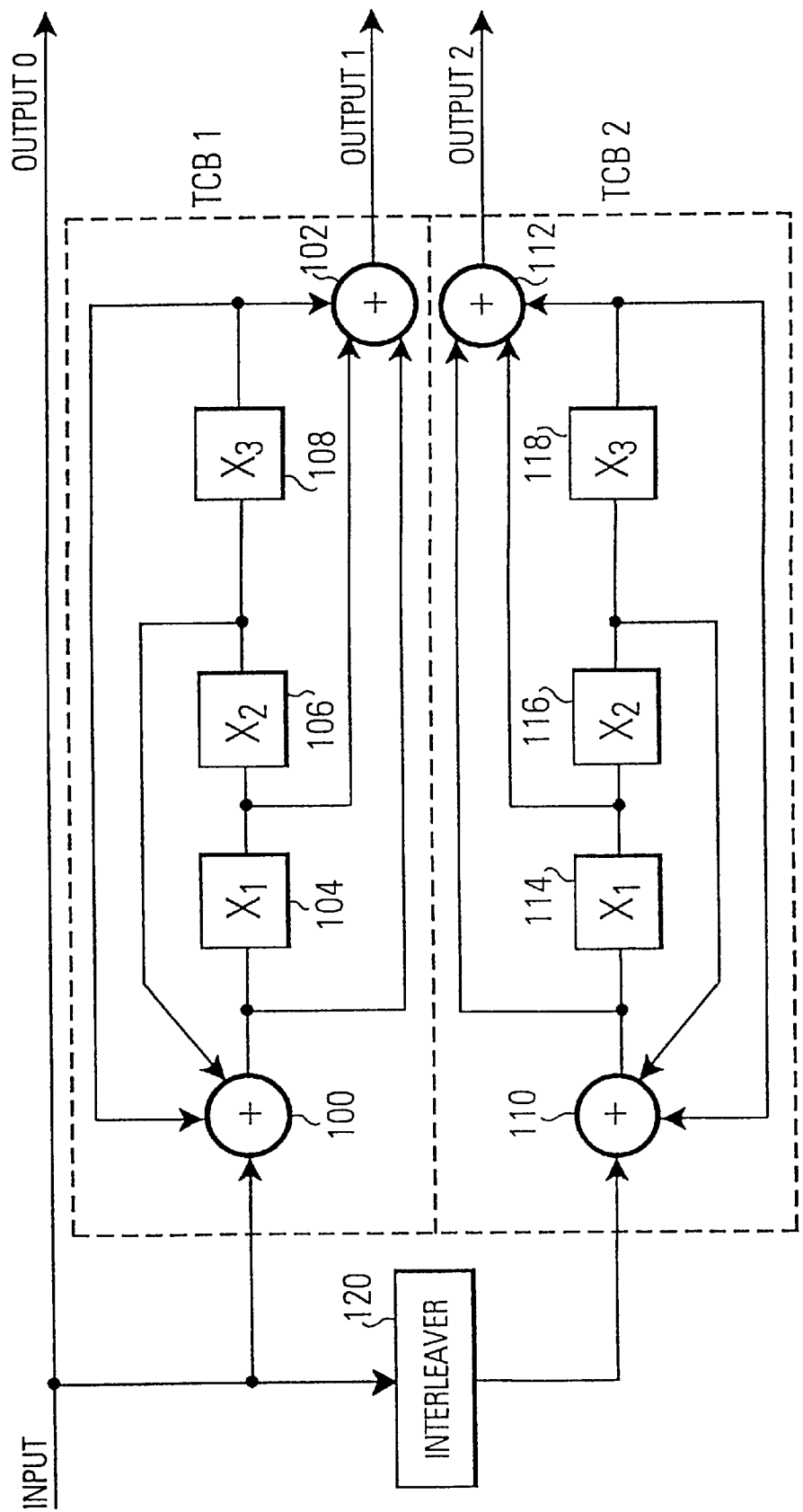
FIG. 8 shows a schematic diagram of a turbo coder comprising an interleaver as well as turbo coding blocks TCB1 and TCB2.

FIG. 4 shows a circuit diagram of a specific serial turbo coder block as it may be used in the turbo coder shown in FIG. 8.

Here, it should be noted that the provision of an input delay unit 16 and an output delay unit 18 per se is not a prerequisite in case of a serial implementation but becomes necessary in case of parallization to collect the elements of the input vectors and output vector as shown in FIG. 3.

The serial turbo coder block shown in FIG. 4 may be shortly described by N=3, M=1, $\alpha=[\alpha_1, \alpha_2, \alpha_3]=[0, 1, 1]$, $\beta=[\beta_1, \beta_2, \beta_3, \beta_4]=[1, 1, 0, 1]$ using the formal description according to eq. (1) introduced above. In the following it will be explained how this serial turbo coder block may be parallalized into a n=2, 4, and 8 bit parallel turbo coder block.

3.1 Example: 2 bit parallel turbo coder for N=3, M=1, $\alpha=[0, 1, 1]$, $\beta=[1, 1, 0, 1]$ Starting from equation (1) we obtain $$x_1(t)=I(t-1)\oplus x_2(t-1)\oplus x_3(t-1)$$

$$x_2(t)=x_1(t-1)$$

$$x_3(t)=x_2(t-1)$$

$$Q(t)=I(t-1)\oplus x_1(t-1)\oplus x_2(t-1)$$

as description for the turbo coder block shown in FIG. 4. The following backward time index transitions over two serial time cycles are necessary:

$x_1(t) = I(t-1) \oplus x_2(t-1) \oplus x_3(t-1)$
<=> $x_1(t) = I(t-1) \oplus x_1(t-2) \oplus x_2(t-2)$
which is in view of the parallel circuit:
=> $x_1(p) = I0(p-1) \oplus x_1(p-1) \oplus x_2(p-1)$
$x_2(t) = x_1(t-1)$
<=> $x_2(t) = I(t-2) \oplus x_2(t-2) \oplus x_3(t-2)$ -continued

```
which is in view of the parallel circuit:
=>      x₂(p) = I1(p-1) ⊕ x₂(p-1) ⊕ x₃(p-1)
        x₃(t) = x₂(t-1)
<=>     x₃ (t) = x₁(t-2)
which is in view of the parallel circuit:
=>      x₃(p) = x₁(p-1)
        Q(t) = I(t-1) ⊕ x₁(t-1) ⊕ x₂(t-1)
<=>     Q(t) = I(t-1) ⊕ [I(t-2) ⊕ x₂(t-2) ⊕ x₃(t-2)] ⊕ x₁(t-2)
which is in view of the parallel circuit:
=>      Q0(p) = I0(p-1) ⊕ I1(p-1) ⊕ x₁(p-1) ⊕ x₂(p-1) ⊕ x₃(p-1)
        Q(t-1) = I(t-2) ⊕ x₁(t-2) ⊕ x₂(t-2)
which is in view of the parallel circuit:
=>      Q1(p) = I1(p-1) ⊕ x₁(p-1) ⊕ x₂(p-1)
```

Figure 5:
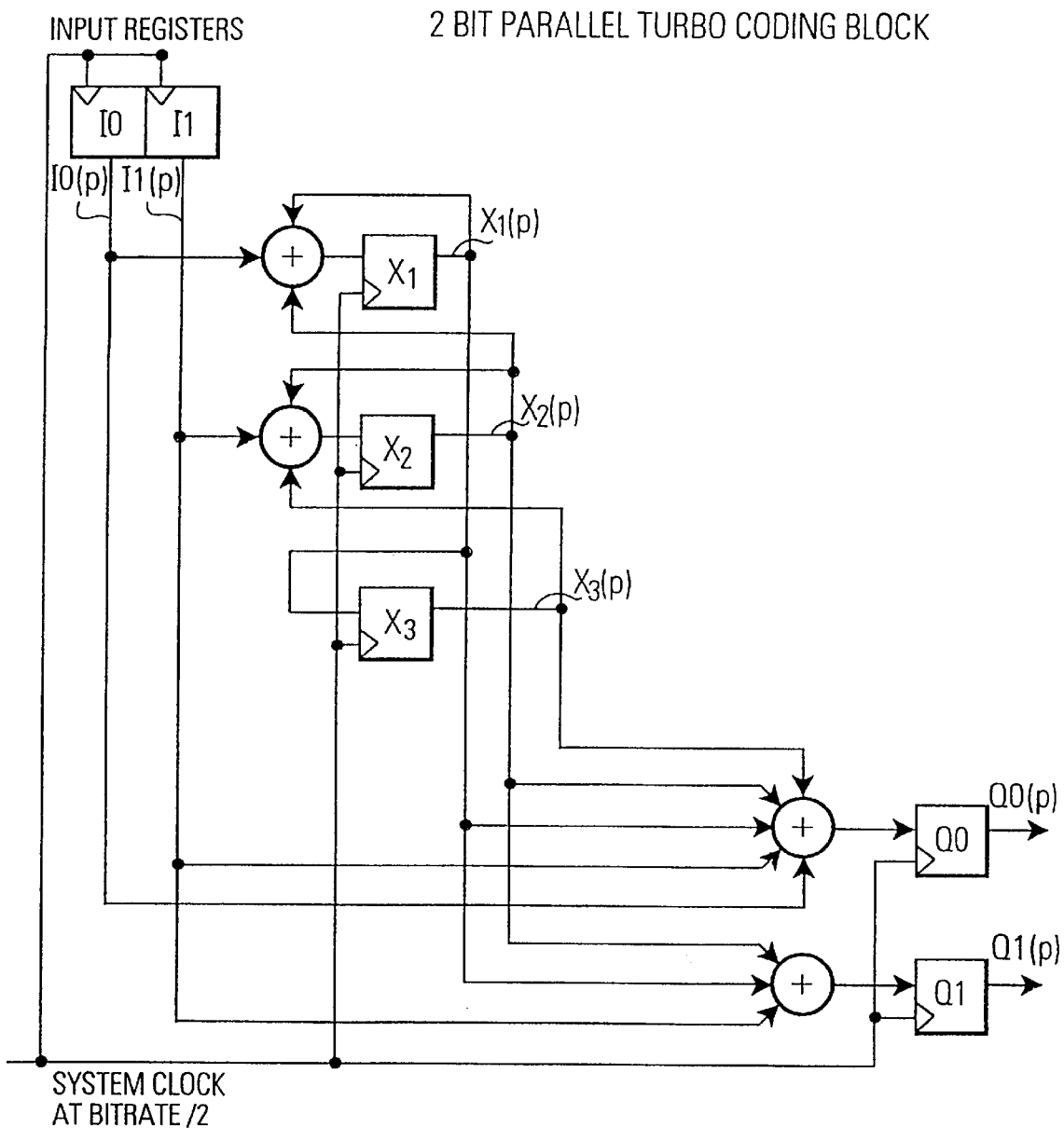
FIG. 5 shows a circuit diagram for a two bit parallel implementation of the turbo coder block shown in FIG. 4.

FIG. 5 shows the result of this parallelization process, i.e. a circuit diagram for a two bit parallel implementation of the turbo coding block shown in FIG. 4.

3.2 Example: 4 Bit Parallel Turbo Coder for N=3, M=1, α=[0, 1, 1], β=[1, 1, 0, 1]

Starting from equation (1) we obtain $$x_1(t)=I(t-1)\oplus x_2(t-1)\oplus x_3(t-1)$$

$$x_2(t)=x_1(t-1)$$

$$x_3(t)=x_2(t-1)$$

$$Q(t)=I(t-1)\oplus x_1(t-1)\oplus x_2(t-1)$$

as description for the turbo coder block shown in FIG. 4. The following backward time index transitions over four serial time cycles are necessary:

```
        x₁(t) = I(t-1) ⊕ x₂(t-1) ⊕ x₃(t-1)
<=>     x₁(t) = I(t-1) ⊕ x₁(t-2) ⊕ x₂(t-2)
<=>     x₁(t) = I(t-1) ⊕ I(t-3) ⊕ x₁(t-3) ⊕ x₃(t-3) ⊕ x₁(t-3)
<=>     x₁(t) = I(t-1) ⊕ I(t-3) ⊕ x₁(t-4) ⊕ x₂(t-4) ⊕
                I(t-4) ⊕ x₂(t-4) ⊕ x₃(t-4)
which is in view of the parallel circuit:
=>      x₁(p) = I0(p-1) ⊕ I2(p-1) ⊕ I3(p-1) ⊕ x₁(p-1) ⊕ x₃(p-1)
        x₂(t) = x₁(t-1)
<=>     x₂(t) = I(t-2) ⊕ x₂(t-2) ⊕ x₃(t-2)
<=>     x₂(t) = I(t-2) ⊕ x₁(t-3) ⊕ x₂(t-3)
<=>     x₂(t) = I(t-2) ⊕ [I(t-4) ⊕ x₂(t-4) ⊕ x₃(t-4)] ⊕ x₁(t-4)
which is in view of the parallel circuit:
=>      x₂(p) = I1(p-1) ⊕ I3(p-1) ⊕ x₁(p-1) ⊕ x₂(p-1) ⊕ x₃(p-1)
        x₃(t) = x₂(t-1)
<=>     x₃(t) = x₁(t-2)
<=>     x₃(t) = [I(t-3) ⊕ x₂(t-3) ⊕ x₃(t-3)]
<=>     x₃(t) = I(t-3) ⊕ x₁(t-4) ⊕ x₂(t-4)
which is in view of the parallel circuit:
=>      x₃(p) = I2(p-1) ⊕ x₁(p-1) ⊕ x₂(p-1)
        Q(t) = I(t-1) ⊕ x₁(t-1) ⊕ x₂(t-1)
<=>     Q(t) = I(t-1) ⊕ [I(t-2) ⊕ x₂(t-2) ⊕ x₃(t-2)] ⊕ x₁(t-2)
<=>     Q(t) = I(t-1) ⊕ I(t-2) ⊕ x₁(t-3) ⊕ x₂(t-3) ⊕
                [I(t-3) ⊕ x₂(t-3) ⊕ x₃(t-3)]
<=>     Q(t) = I(t-1) ⊕ I(t-2) ⊕ I(t-3) ⊕
                [I(t-4) ⊕ x₂(t-4) ⊕ x₃(t-4)] ⊕ x₂(t-4)
which is in view of the parallel circuit:
=>      Q0(p) = I0(p-1) ⊕ I1(p-1) ⊕ I2(p-1) ⊕ I3(p-1) ⊕ x₃(p-1)
        Q(t-1) = I(t-2) ⊕ x₁(t-2) ⊕ x₂(t-2)
<=>     Q(t-1) = I(t-2) ⊕ [I(t-3) ⊕ x₂(t-3) ⊕ x₃(t-3) ] ⊕
                x₁(t-3)
<=>     Q(t-1) = I(t-2) ⊕ I(t-3) ⊕ x₁(t-4) ⊕ x₂(t-4) ⊕
                [I(t-4) ⊕ x₂(t-4) ⊕ x₃(t-4) ]
which is in view of the parallel circuit:
=>      Q1(p) = I1(p-1) ⊕ I2(p-1) ⊕ I3(p-1) ⊕ x₁(p-1) ⊕ x₃(p-1)
        Q(t-2) = I(t-3) ⊕ x₁(t-3) ⊕ x₂(t-3)
<=>     Q(t-2) = I(t-3) ⊕ [I(t-4) ⊕ x₂(t-4) ⊕ x₃(t-4 ) ] ⊕
                x₁(t-4)
```

-continued

```
which is in view of the parallel circuit:
=>      Q2(p) = I2(p-1) ⊕ I3(p-1) ⊕ x₁(p-1) ⊕ x₂(p-1) ⊕ x₃(p-1)
        Q(t-3) = I(t-4) ⊕ x₁(t-4) ⊕ x₂(t-4)
which is in view of the parallel circuit:
=>      Q3(p) = I3(p-1) ⊕ x₁(p-1) ⊕ x₂(p-1)
```

Figure 6:
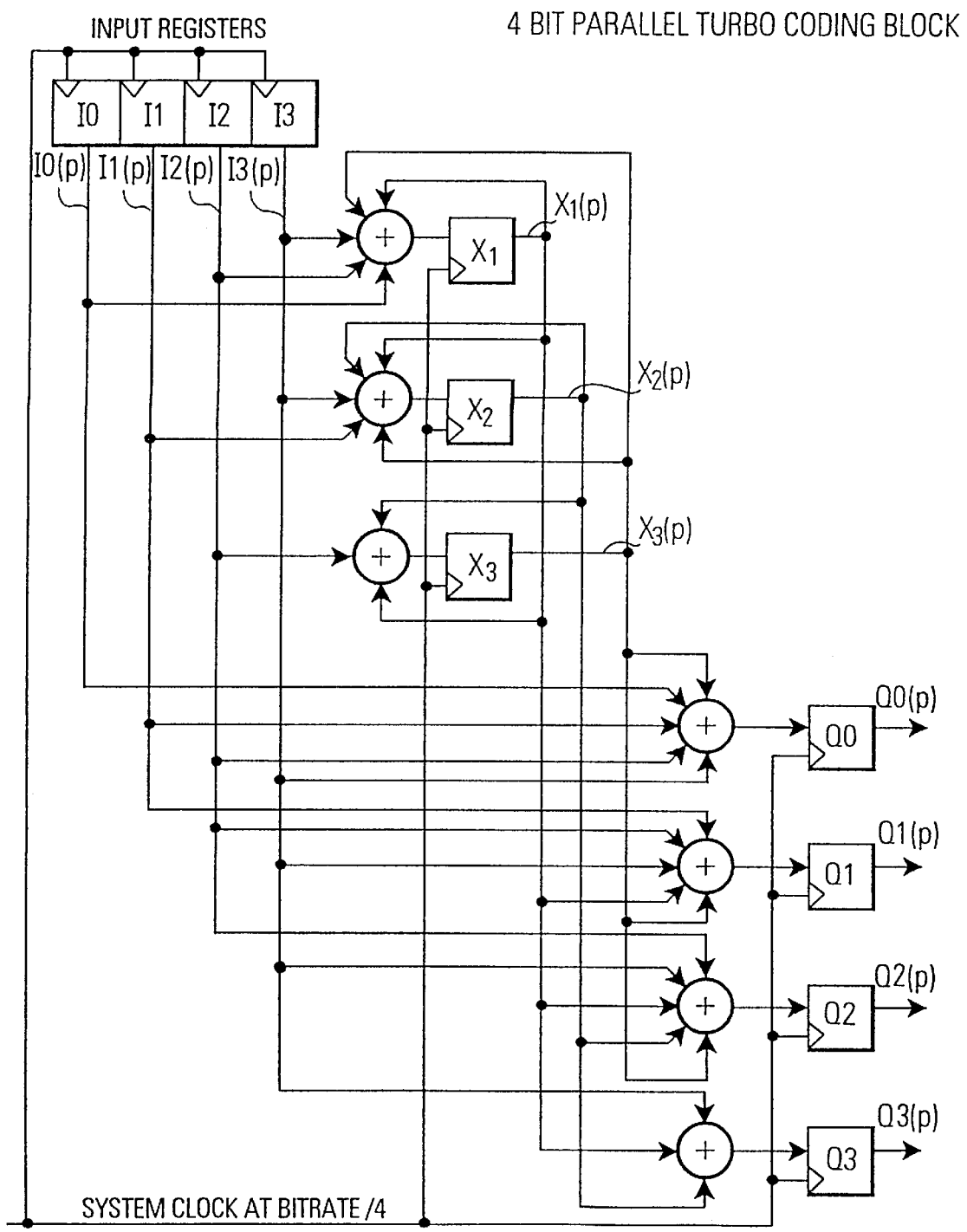
FIG. 6 shows a circuit diagram for a four bit parallel implementation of the turbo coder block shown in FIG. 4.

FIG. 6 shows the result of this parallelization process, i.e. a circuit diagram for a four bit parallel implementation of the turbo coding block shown in FIG. 4.

3.3 Example: 8 Bit Parallel Turbo Coder for N=3, M=1, α=[0, 1, 1], β=[1, 1, 0, 1]

Starting from equation (1) we obtain $$x_1(t)=I(t-1)\oplus x_2(t-1)\oplus x_3(t-1)$$

$$x_2(t)=x_1(t-1)$$

$$x_3(t)=x_2(t-1)$$

$$Q(t)=I(t-1)\oplus x_1(t-1)\oplus x_2(t-1)$$

as description for the turbo coder block shown in FIG. 4. The following backward time index transitions over eight serial time cycles are necessary:

```
        x₁(t) = I(t-1) ⊕ x₂(t-1) ⊕ x₃(t-1)
<=>     x₁(t) = I(t-1) ⊕ x₁(t-2) ⊕ x₂(t-2)
<=>     x₁(t) = I(t-1) ⊕ [I(t-3) ⊕ x₂(t-3) ⊕ x₃(t-3)] ⊕ x₁(t-3)
<=>     x₁(t) = I(t-1) ⊕ I(t-3) ⊕ x₁ (t-4) ⊕ x₂(t-4) ⊕
                [I(t-4) ⊕ x₂(t-4) ⊕ x₃(t-4)]
<=>     x₁(t) = I(t-1) ⊕ I(t-3) ⊕ I(t-4) ⊕
                [I(t-5) ⊕ x₂(t-5) ⊕ x₃(t-5)] ⊕ x₂(t-5)
<=>     x₁(t) = I(t-1) ⊕ I(t-3) ⊕ I(t-4) ⊕ I(t-5) ⊕ x₂(t-6)
<=>     x₁(t) = I(t-1) ⊕ I(t-3) ⊕ I(t-4) ⊕ I(t-5) ⊕ x₁(t-7)
<=>     x₁(t) = I(t-1) ⊕ I(t-3) ⊕ I(t-4) ⊕ I(t-5) ⊕
                [I(t-8) ⊕ x₂(t-8) ⊕ x₃(t-8)]
which is in view of the parallel circuit:
->      x₁(p) = I0(p-1) ⊕ I2(p-1) ⊕ I3(p-1) ⊕ I4(p-1) ⊕
                I7(p-1) ⊕ x₂ (p-1) ⊕ x₃(p-1)
        x₂(t) = x₁(t-1)
<=>     x₂(t) = [I(t-2) ⊕ x₂(t-2) ⊕ x₃(t-2)]
<=>     x₂(t) = I(t-2) ⊕ x₁(t-3) ⊕ x₂(t-3)
<=>     x₂(t) = I(t-2) ⊕ [I(t-4) ⊕ x₂(t-4) ⊕ x₃(t-4)] ⊕
                x₁(t-4)
<=>     x₂(t) = I(t-2) ⊕ I(t-4) ⊕ x₁(t-5) ⊕ x₂(t-5) ⊕
                [I(t-5) ⊕ x₂(t-5) ⊕ x₃(t-5)]
<=>     x₂(t) = I(t-2) ⊕ I(t-4) ⊕ I(t-5) ⊕
                [I(t-6 ) ⊕ x₂(t-6) ⊕ x₃(t-6)] ⊕ x₂(t-6)
<=>     x₂(t) = I(t-2) ⊕ I(t-4) ⊕ I(t-5) ⊕ I(t-6) ⊕ x₂(t-7)
<=>     x₂(t) = I(t-2) ⊕ I(t-4) ⊕ I(t-5) ⊕ I(t-6) ⊕ x₁(t-8)
which is in view of the parallel circuit:
=>      x₂(p) = I1(p-1) ⊕ I3(p-1) ⊕ I4(p-1) ⊕ I5(p-1) ⊕ x₁(p-1)
        x₃(t) = x₂(t-1)
<=>     x₃(t) = x₁(t-2)
<=>     x₃(t) = [I(t-3) ⊕ x₂(t-3) ⊕ x₃(t-3)]
<=>     x₃(t) = I(t-3) ⊕ x₁(t-4) ⊕ x₂(t-4)
<=>     x₃(t) = I(t-3) ⊕ [I(t-5) ⊕ x₂(t-5) ⊕ x₃(t-5)] ⊕ x₁(t-5)
<=>     x₃(t) = I(t-3) ⊕ I(t-5) ⊕ x₁(t-6) ⊕ x₂(t-6) ⊕
                [I(t-6) ⊕ x₂(t-6) ⊕ x₃(t-6)]
<=>     x₃(t) = I(t-3) ⊕ I(t-5) ⊕ I(t-6) ⊕
                [I(t-7) ⊕ x₂(t-7) ⊕ x₃(t-7)] ⊕ x₂(t-7)
<=>     x₃(t) = I(t-3) ⊕ I(t-5) ⊕ I(t-6) ⊕ I(t-7) ⊕ x₂(t-8)
which is in view of the parallel circuit:
=>      x₃(p) = I2(p-1) ⊕ I4(p-1) ⊕ I5(p-1) ⊕ I6(p-1) ⊕ x₂(p-1)
        Q(t) = I(t-1) ⊕ x₁(t-1) ⊕ x₂(t-1)
<=>     Q(t) = I(t-1) ⊕ [I(t-2) ⊕ x₂(t-2) ⊕ x₃(t-2)] ⊕ x₁(t-2)
<=>     Q(t) = I(t-1) ⊕ I(t-2) ⊕ x₁(t-3) ⊕ x₂((t-3) ⊕
                [I(t-3) ⊕ x₂(t-3) ⊕ x₃(t-3)]
<=>     Q(t) = I(t-1) ⊕ I(t-2) ⊕ I(t-3) ⊕
                [I(t-4) ⊕ x₂((t-4) ⊕ x₃(t-4)] ⊕ x₂((t-4)
<=>     Q(t) = I(t-1) ⊕ I(t-2) ⊕ I(t-3) ⊕ I(t-4) ⊕ x₂((t-5)
<=>     Q(t) = I(t-1) ⊕ I(t-2) ⊕ I(t-3) ⊕ I(t-4) ⊕ x₁(t-6)
```

-continued $$\begin{aligned}
\Leftrightarrow \quad & Q(t) = I(t-1) \oplus I(t-2) \oplus I(t-3) \oplus I(t-4) \oplus \\
& [I(t-7) \oplus x_2(t-7) \oplus x_3(t-7)] \\
\Leftrightarrow \quad & Q(t) = I(t-1) \oplus I(t-2) \oplus I(t-3) \oplus I(t-4) \oplus I(t-7) \oplus \\
& x_1(t-8) \oplus x_2(t-8)
\end{aligned}$$

which is in view of the parallel circuit:

$$\begin{aligned}
\Rightarrow \quad & Q0(p) = I0(p-1) \oplus I1(p-1) \oplus I2(p-1) \oplus I3(p-1) \oplus \\
& I6(p-1) \oplus x_1(p-1) \oplus x_2(p-1) \\
& Q(t-1) = I(t-2) \oplus x_1(t-2) \oplus x_2(t-2) \\
\Leftrightarrow \quad & Q(t-1) = I(t-2) \oplus [I(t-3) \oplus x_2(t-3) \oplus x_3(t-3)] \oplus \\
& x_1(t-3) \\
\Leftrightarrow \quad & Q(t-1) = I(t-2) \oplus I(t-3) \oplus x_1(t-4) \oplus x_2((t-4) \oplus \\
& [I(t-4) \oplus x_2(t-4) \oplus x_3(t-4)] \\
\Leftrightarrow \quad & Q(t-1) = I(t-2) \oplus I(t-3) \oplus I(t-4) \oplus \\
& [I(t-5) \oplus x_2(t-5) \oplus x_3(t-5)] \oplus x_2(t-5) \\
\Leftrightarrow \quad & Q(t-1) = I(t-2) \oplus I(t-3) \oplus I(t-4) \oplus I(t-5) \oplus x_2(t-6) \\
\Leftrightarrow \quad & Q(t-1) = I(t-2) \oplus I(t-3) \oplus I(t-4) \oplus I(t-5) \oplus x_1(t-7) \\
\Leftrightarrow \quad & Q(t-1) = I(t-2) \oplus I(t-3) \oplus I(t-4) \oplus I(t-5) \oplus \\
& [I(t-8) \oplus x_2(t-8) \oplus x_3(t-8)]
\end{aligned}$$

which is in view of the parallel circuit:

$$\begin{aligned}
\Rightarrow \quad & Q1(p) = I1(p-1) \oplus I2(p-1) \oplus I3(p-1) \oplus I4(p-1) \oplus \\
& I7(p-1) \oplus x_2(p-1) \oplus x_3(p-1) \\
& Q(t-2) = I(t-3) \oplus x_1(t-3) \oplus x_2(t-3) \\
\Leftrightarrow \quad & Q(t-2) = I(t-3) \oplus [I(t-4) \oplus x_2(t-4) \oplus x_3(t-4)] \oplus \\
& x_1(t-4) \\
\Leftrightarrow \quad & Q(t-2) = I(t-3) \oplus I(t-4) \oplus x_1(t-5) \oplus x_2(t-5) \oplus \\
& [I(t-5) \oplus x_2(t-5) \oplus x_3(t-5)] \\
\Leftrightarrow \quad & Q(t-2) = I(t-3) \oplus I(t-4) \oplus I(t-5) \oplus \\
& [I(t-6) \oplus x_2(t-6) \oplus x_3(t-6)] \oplus x_2(t-6) \\
\Leftrightarrow \quad & Q(t-2) = I(t-3) \oplus I(t-4) \oplus I(t-5) \oplus I(t-6) \oplus x_2(t-7) \\
\Leftrightarrow \quad & Q(t-2) = I(t-3) \oplus I(t-4) \oplus I(t-5) \oplus I(t-6) \oplus x_1(t-8)
\end{aligned}$$

which is in view of the parallel circuit:

$$\begin{aligned}
\Rightarrow \quad & Q2(p) = I2(p-1) \oplus I3(p-1) \oplus I4(p-1) \oplus I5(p-1) \oplus x_1(p-1) \\
& Q(t-3) = I(t-4) \oplus x_1(t-4) \oplus x_2(t-4) \\
\Leftrightarrow \quad & Q(t-3) = I(t-4) \oplus [I(t-5) \oplus x_2(t-5) \oplus x_3(t-5)] \oplus \\
& x_1(t-5) \\
\Leftrightarrow \quad & Q(t-3) = I(t-4) \oplus I(t-5) \oplus x_1(t-6) \oplus x_2(t-6) \oplus \\
& [I(t-6) \oplus x_2(t-6) \oplus x_3(t-6)] \\
\Leftrightarrow \quad & Q(t-3) = I(t-4) \oplus I(t-5) \oplus I(t-6) \oplus \\
& [I(t-7) \oplus x_2(t-7) \oplus x_3(t-7)] \oplus x_2(t-7) \\
\Leftrightarrow \quad & Q(t-3) = I(t-4) \oplus I(t-5) \oplus I(t-6) \oplus I(t-7) \oplus x_2(t-8)
\end{aligned}$$

which is in view of the parallel circuit:

$$\begin{aligned}
\Rightarrow \quad & Q3(p) = I3(p-1) \oplus I4(p-1) \oplus I5(p-1) \oplus I6(p-1) \oplus x_2(p-1) \\
& Q(t-4) = I(t-5) \oplus x_1(t-5) \oplus x_2(t-5) \\
\Leftrightarrow \quad & Q(t-4) = I(t-5) \oplus [I(t-6) \oplus x_2(t-6) \oplus x_3(t-6)] \oplus \\
& x_1(t-6) \\
\Leftrightarrow \quad & Q(t-4) = I(t-5) \oplus I(t-6) \oplus x_1(t-7) \oplus x_2(t-7) \oplus \\
& [I(t-7) \oplus x_2(t-7) \oplus x_3(t-7)] \\
\Leftrightarrow \quad & Q(t-4) = I(t-5) \oplus I(t-6) \oplus I(t-7) \oplus \\
& [I(t-8) \oplus x_2(t-8) \oplus x_3(t-8)] \oplus x_2(t-8)
\end{aligned}$$

which is in view of the parallel circuit:

$$\begin{aligned}
\Rightarrow \quad & Q4(p) = I4(p-1) \oplus I5(p-1) \oplus I6(p-1) \oplus I7(p-1) \oplus x_3(p-1) \\
& Q(t-5) = I(t-6) \oplus x_1(t-6) \oplus x_2(t-6) \\
\Leftrightarrow \quad & Q(t-5) = I(t-6) \oplus [I(t-7) \oplus x_2(t-7) \oplus x_3(t-7)] \oplus \\
& x_1(t-7) \\
\Leftrightarrow \quad & Q(t-5) = I(t-6) \oplus I(t-7) \oplus x_1(t-8) \oplus x_2(t-8) \oplus \\
& [I(t-8) \oplus x_2(t-8) \oplus x_3(t-8)]
\end{aligned}$$

which is in view of the parallel circuit:

$$\begin{aligned}
\rightarrow \quad & Q5(p) = I5(p-1) \oplus I6(p-1) \oplus I7(p-1) \oplus x_1(p-1) \oplus x_3(p-1) \\
& Q(t-6) = I(t-7) \oplus x_1(t-7) \oplus x_2(t-7) \\
\Leftrightarrow \quad & Q(t-6) = I(t-7) \oplus [I(t-8) \oplus x_2(t-8) \oplus x_3(t-8)] \oplus \\
& x_1(t-8)
\end{aligned}$$

which is in view of the parallel circuit:

$$\begin{aligned}
\Rightarrow \quad & Q6(p) = I6(p-1) \oplus I7(p-1) \oplus x_1(p-1) \oplus x_2(p-1) \oplus x_3(p-1) \\
& Q(t-7) = I(t-8) \oplus x_1(t-8) \oplus x_2(t-8)
\end{aligned}$$

which is in view of the parallel circuit:

$$\rightarrow \quad Q7(p) = I7(p-1) \oplus x_1(p-1) \oplus x_2(p-1)$$

Figure 7A:
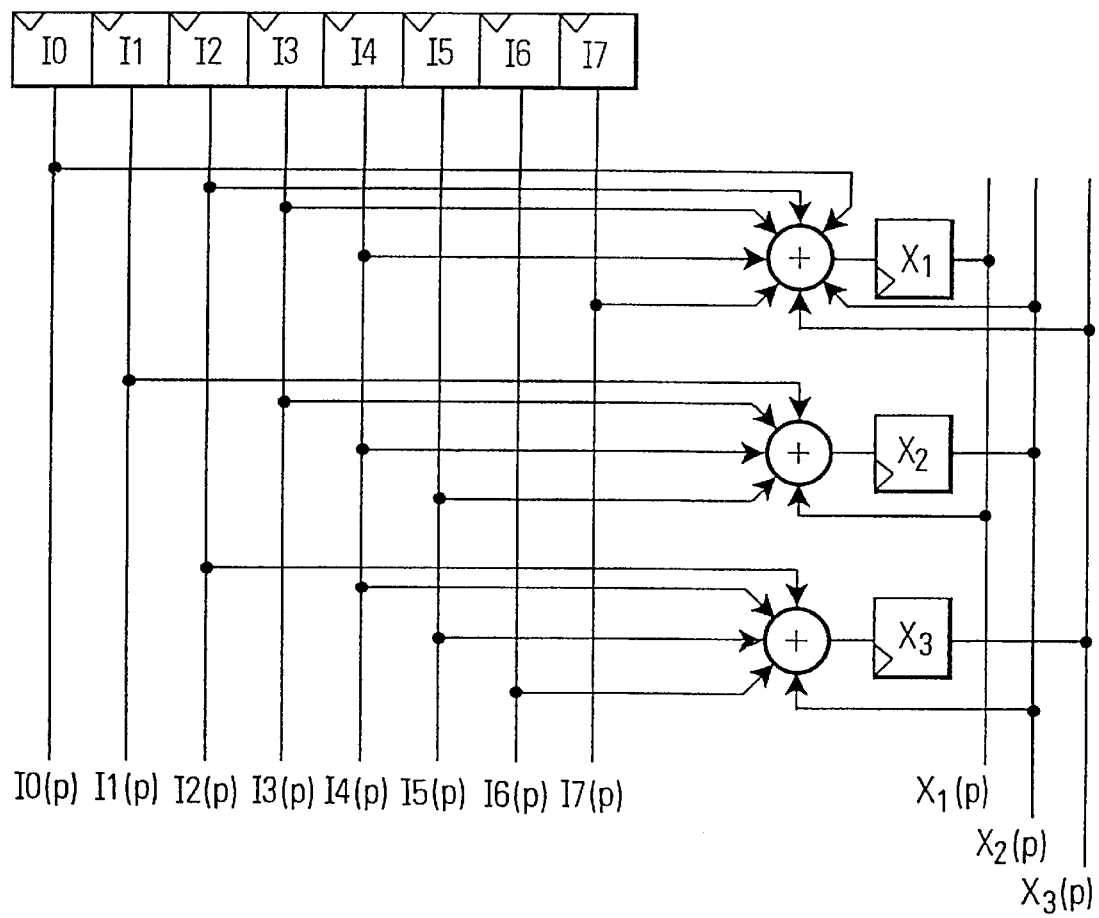
FIG. 7A shows a circuit diagram of the input part of an eight bit parallel implementation of the turbo coder block shown in FIG. 4.
Figure 7B:
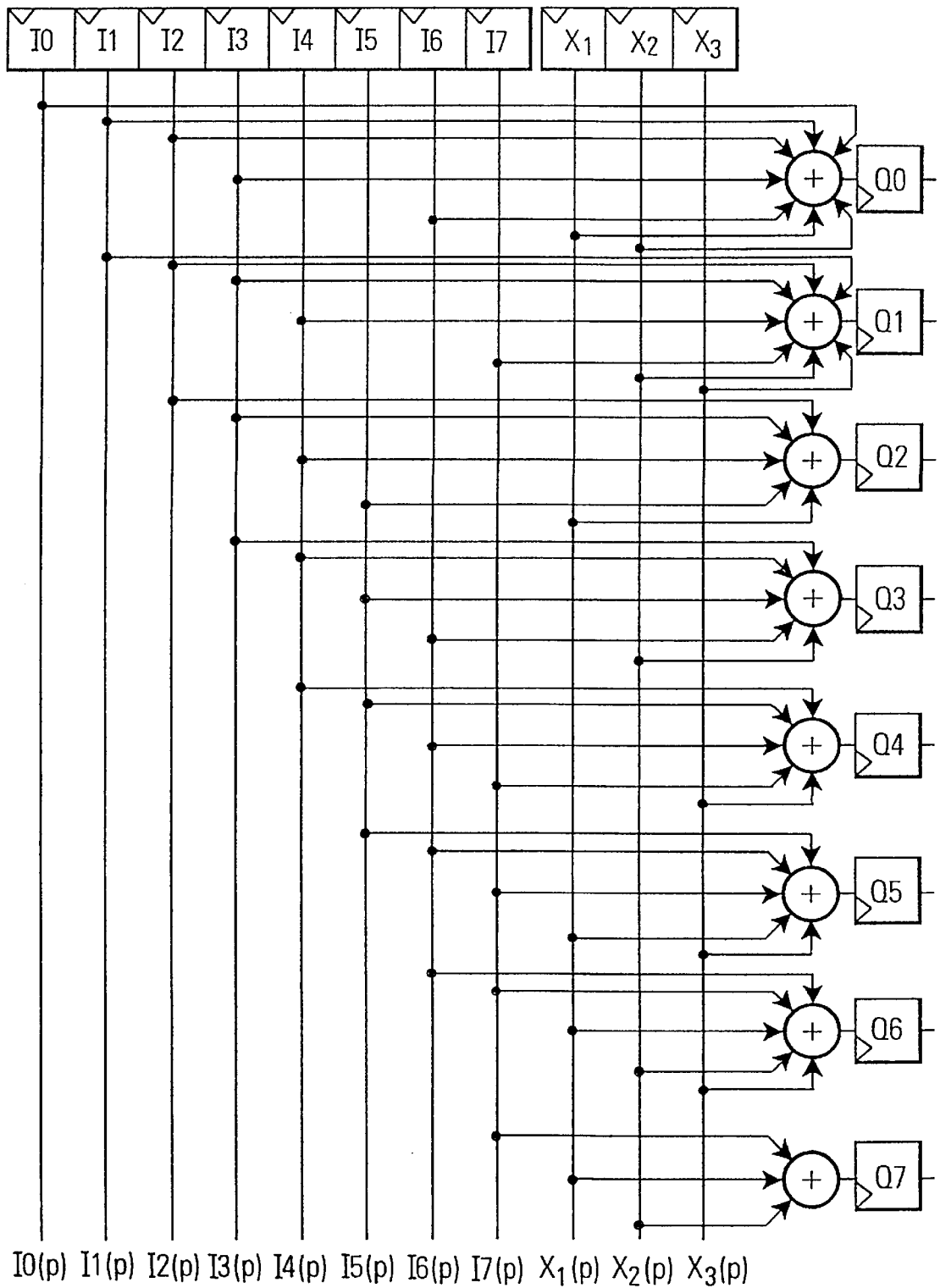
FIG. 7B shows a circuit diagram for an output part of the parallel implementation of the turbo coder block shown in FIG. 4.

FIGS. 7A and 7B show the result of this parallelization process, i.e. a circuit diagram for an eight bit parallel implementation of the turbo coding block shown in FIG. 4.

4. VHDL Code

The recursive parallelization described above in a step-by-step manner may be used with logic synthesis tools to compare different design alternatives. Without restriction to any such particular system, here, reference is made to the Very High Speed Hardware Discription Language VHDL as being a typical example for the design of logic circuits using logic synthesis tools.

An advantage of the VHDL Code approach to the implementation of the turbo coder block parallelization result is that a design may be realized in a very short time without being bound to a specific technology, e.g., ASIC or FPGA.

Thus, the actual technology is not specified through the turbo coder block parallelization result but may be set as parameter to be handled by the logic synthesis tool subsequent to coding and thus be changed easily to compare different design options.

In the following, VHDL codes are listed for the 2, 4, and 8 bit parallelized turbo coder blocks shown in FIGS. 5, 6, and 7. Since the use of the VHDL code language is known in the art and the relation to the parallelization results explained above are self-evident no further explanation of details will be given here.

```
LIBRARY ieee;
USE ieee.std_logic_1164.ALL;
USE ieee.std_logic_arith.ALL;
ENTITY en_turbo_coder_rtl IS
    PORT (
        -- General:
        reset_p         : IN STD_LOGIC;
        clk32m          : IN STD_LOGIC; -- Clock
                                        (rising edge triggered)
        input_8         : IN std_logic_vector (7 DOWNTO 0);
        input_4         : IN std_logic_vector (3 DOWNTO 0);
        input_2         : IN std_logic_vector (1 DOWNTO 0);
        input_1         : IN std_logic;
        -- turboCoding 2 bit parallel
        output_8        : OUT std_logic_vector (7 DOWNTO 0);
        output_4        : OUT std_logic_vector (3 DOWNTO 0);
        output_2        : OUT std_logic_vector (1 DOWNTO 0);
        output_1        : OUT std_logic
    );
    END en_turbo_coder_rtl;
    ARCHITECTURE rtl OF en_turbo_coder_rtl IS
SIGNAL s1_x1        : std_logic;
SIGNAL s1_x2        : std_logic;
SIGNAL s1_x3        : std_logic;
SIGNAL s1_i         : std_logic;
SIGNAL s1_o         : std_logic;
SIGNAL s2_x1        : std_logic;
SIGNAL s2_x2        : std_logic;
SIGNAL s2_x3        : std_logic;
SIGNAL s2_i         : std_logic_vector (1 DOWNTO 0);
SIGNAL s2_o         : std_logic_vector (1 DOWNTO 0);
SIGNAL S4_x1        : std_logic;
SIGNAL s4_x2        : std_logic;
SIGNAL s4_x3        : std_logic;
SIGNAL s4_i         : std_logic_vector (3 DOWNTO 0);
SIGNAL s4_o         : std_logic_vector (3 DOWNTO 0);
SIGNAL s8_x1        : std_logic;
SIGNAL s8_x2        : std_logic;
SIGNAL s8_x3        : std_logic;
SIGNAL s8_i         : std_logic_vector (7 DOWNTO 0);
SIGNAL s8_o         : std_logic_vector (7 DOWNTO 0);
BEGIN
    tc_1: PROCESS (clk32m, reset_p) -- seriell building of
        turbo coder block TCB
    BEGIN
        IF reset_p = '1' THEN
            s1_x1 <= '0';
            s1_x2 <= '0';
            s1_x3 <= '0';
            s1_i  <= '0';
            s1_o  <= '0';
        ELSIF clk32m'EVENT AND clk32m = '1' THEN
            s1_i  <= input_1;
            s1_x1 <= s1_i XOR s1_x2 XOR s1_x3;
            s1_x2 <= s1_x1;
```

```
            s1_x3 <= s1_x2;
            s1_o <= s1_i XOR s1_x2 XOR s1_x1;
        END IF;
    END PROCESS tc_1;
    output_1 <= s1_o;
    tc_2: PROCESS (clk32m, reset_p) -- 2bit parallel building
        of turbo coder block
    BEGIN
        IF reset_p = '1' THEN
            s2_x1 <= '0';
            s2_x2 <= '0';
            s2_x3 <= '0';
            s2_i <= (OTHERS => '0');
            s2_o <= (OTHERS => '0');
        ELSIF clk32m'EVENT AND clk32m = '1' THEN
            s2_i <= input_2;
            s2_x1 <= s2_i (0) XOR s2_x1 XOR s2_x2;
            s2_x2 <= s2_i (1) XOR s2_x2 XOR s2_x3;
            s2_x3 <= s2_x1;
            s2_o (0) <= s2_i (0) XOR
                s2_i (1) XOR s2_x1 XOR s2_x2 XOR s2_x3;
            s2_o (1) <= s2_i (1) XOR s2_x1 XOR s2_x2;
        END IF;
    END PROCESS tc_2;
    output_2 <= s2_o;
    tc_4: PROCESS (clk32m, reset_p) -- 4bit parallel building
        of turbo coder block
    BEGIN
        IF reset_p = '1' THEN
            s4_x1 <= '0';
            s4_x2 <= '0';
            s4_x3 <= '0';
            s4_i <= (OTHERS => '0');
            s4_o <= (OTHERS => '0');
        ELSIF clk32m'EVENT AND clk32m = '1' THEN
            s4_i <= input_4;
            s4_x1 <= s4_i (0) XOR s4_i (2) XOR s4_i (3)
                XOR s4_x1 XOR s4_x3;
            s4_x2 <= s4_i (1) XOR s4_i (3) XOR s4_x1
                XOR s4_x2 XOR s4_x3;
            s4_x3 <= s4_i (2) XOR s4_x1 XOR s4_x2;
            s4_o (0) <= s4_i (0) XOR s4_i (1) XOR s4_i (2)
                XOR s4_i (3) XOR s4_x3;
            s4_o (1) <= s4_i (1) XOR s4_i (2) XOR s4_i (3)
                XOR s4_x1 XOR s4_x3;
            s4_o (2) <= s4_i (2) XOR s4_i (3) XOR s4_x1
                XOR s4_x2 XOR s4_x3;
            s4_o (3) <= s4_i (3) XOR s4_x1 XOR s4_x2;
        END IF;
    END PROCESS tc_4;
    output_4 <= s4_o;
    tc_8: PROCESS (clk32m, reset_p) -- 8bit parallel building
        of turbo coder block
    BEGIN
        IF reset_p = '1' THEN
            s8_x1 <= '0';
            s8_x2 <= '0';
            s8_x3 <= '0';
            s8_i <= (OTHERS => '0');
            s8_o <= (OTHERS => '0');
        ELSIF clk32m'EVENT AND clk32m = '1' THEN
            s8_i <= input_8;
            s8_x1 <= s8_i (0) XOR s8_i (2) XOR s8_i (3)
                XOR s8_i (4) XOR s8_i (7)
                XOR s8_x2 XOR s8_x3;
            s8_x2 <= s8_i (1) XOR s8_i (3) XOR s8_i (4)
                XOR s8_i (5) XOR s8_x1;
            s8_x3 <= s8_i (2) XOR s8_i (4) XOR s8_i (5)
                XOR s8_i (6) XOR s8_x2;
            s8_o (0) <= s8_i (0) XOR s8_i (1) XOR s8_i (2)
                XOR s8_i (3) XOR s8_i (6)
                XOR s8_x1 XOR s8_x2;
            s8_o (1) <= s8_i (1) XOR s8_i (2) XOR s8_i (3)
                XOR s8_i (4) XOR s8_i (7)
                XOR s8_x2 XOR s8_x3;
            s8_o (2) <= s8_i (2) XOR s8_i (3) XOR s8_i (4)
                XOR s8_i (5) XOR s8_x1;
            s8_o (3) <= s8_i (3) XOR s8_i (4) XOR s8_i (5)
                XOR s8_i (6) XOR s8_x2;
            s8_o (4) <= s8_i (4) XOR s8_i (5) XOR s8_i (6)
                XOR s8_i (7) XOR s8_x3;
            s8_o (5) <= s8_i (5) XOR s8_i (6) XOR s8_i (7)
                XOR s8_x1 XOR s8_x3;
            s8_o (6) <= s8_i (6) XOR s8_i (7) XOR s8_x1
                XOR s8_x2 XOR s8_x3;
            s8_o (7) <= s8_i (7) XOR s8_x1 XOR s8_x2;
        END IF;
    END PROCESS tc_8
    output_8 <= s8_o;
END rtl;
```

5. Turbo Coder Realization

While above reference has been made to FIG. 8 with respect to background art of the present invention this FIG. 8 is also related to the present invention as will be shown in the following.

According to the present invention described so far reference has been made to the parallelization of turbo coder blocks with M outputs. Nevertheless, it should be mentioned that according to the present invention the construction of a complete turbo coder requires the instantiation of the parallelized turbo coder block twice, as shown in FIG. 8 (where M=1 is assumed in both blocks).

One turbo coder block is related to the normal input data stream to derive OUTPUT 1 shown in FIG. 8 and the other is related to the interleaved input data stream to derive OUTPUT 2. Since the input data stream is also directly forwarded to OUTPUT 0 the three outputs of the turbo coder have a width of 3n bits per parallel clock cycle, where n is the degree of parallelization.

What is claimed is:

1. A parallel turbo coder implementation method for a serial turbo coder block described according to:

$$x_1(t) = I(t-1) \oplus \alpha_1 \cdot x_1(t-1) \oplus \alpha_2 \cdot x_2(t-1) \oplus \ldots \oplus \alpha_N \cdot x_N(t-1)$$

$$\alpha_i \varepsilon \{0, 1\}$$

$$x_2(t) = x_1(t-1)$$

$$\vdots \qquad \vdots$$

$$x_N(t) = x_{N-1}(t-1)$$

$$Q_j(t) = \beta_{j0} \cdot I(t-1) \oplus$$

$$x_1(t-1) \cdot [\beta_{j0} \cdot \alpha_1 \oplus \beta_{j1}] \oplus$$

$$\vdots$$

$$x_N(t-1) \cdot [\beta_{j0} \cdot \alpha_N \oplus \beta_{jN}]$$

$$\beta_{ij} \varepsilon \{0, 1\}$$

$$j\varepsilon [1, \ldots, N]$$

comprising a) carrying out a time index substitution for a first internal state according to:

$$x_1(t-1) = I(t-2) \oplus \alpha_1 \cdot x_1(t-2) \oplus \quad (2.x_1.1)$$
$$\alpha_2 \cdot x_2(t-2) \oplus \ldots \oplus$$
$$\alpha_N \cdot x_N(t-2)$$
$$\vdots \quad (2.x_1.n-1)$$
$$x_1(t-(n-1)) = I(t-n) \oplus \alpha_1 \cdot x_1(t-n) \oplus$$
$$\alpha_2 \cdot x_2(t-n) \oplus \ldots \oplus$$
$$\alpha_N \cdot x_N(t-n)$$

where n is the degree of parallelization;

b) carrying out a time index substitution for the remaining internal states (i=2, ..., N) according to:

$$x_i(t-1) = x_{i-1}(t-2) \quad (2.x_i.1)$$
$$\vdots \quad (2.x_i.n-1)$$
$$x_i(t-(n-1)) = x_{i-1}(t-n)$$

c) carrying out a time index substitution for the output signal according to:

$$Q_j(t-i) = \beta_{j0} \cdot I(t-(i+1)) \oplus$$
$$x_1(t-(i+1)) \cdot [\beta_{j0} \cdot \alpha_1 \oplus \beta_{j1}] \oplus$$
$$\vdots$$
$$x_N(t-(i+1)) \cdot [\beta_{j0} \cdot \alpha_N \oplus \beta_{jN}]$$
$$i \varepsilon [1, \ldots, n-1]$$
$$(2.Q.i)$$

to derive a parallel output vector:

$$Q_j(t) = Q_j0(p)$$
$$Q_j(t-1) = Q_j1(p)$$
$$\vdots$$
$$Q_j(t-(n-1)) = Q_jn-1(p)$$
$$j \varepsilon [1, \ldots, M]$$

d) carrying out an internal state substitution process for each internal state $x_k(t)$ (k=1, ... N) according to the following:
 d1) set maximum time index element for the internal state $x_k(t)$ to $t_{max}=t-1$;
 d2) scan the representation of the internal state $x_k(t)$ for internal states with maximum time index $t_{max}$;
 d3) execute backward time index transition from $t_{max}$ to $t_{max}-1$ in the representation of the internal state $x_k(t)$ through state variable substitution steps using eqs. (2); and
 d4) decrement $t_{max}$ by a value of 1 and repeat steps d2) to d4) while $t_{max} > t-n$;
e) carrying out an internal state substitution process for each element $Q_j(t-i)$ (i=0, ..., n-2) of each parallel output vector $Q_j(t)$ (j=1, ..., M) according to the following
 e1) set maximum time index element for vector element $Q_j(t-i)$ in the considered parallel output vector $Q_j(t)$ to $t_{max}=t-i-1$;
 e2) scan the representation of the vector element $Q_j(t-i)$ for internal states with maximum time index;
 e3) execute backward time index transition in the representation of the vector element $Q_j(t-i)$ from $t_{max}$ to $t_{max}-1$ through state variable substitution steps using eqs. (2); and
 e4) decrement $t_{max}$ by a value of 1 and repeat steps e2) to e4) while $t_{max} > t-n$.

2. A parallel turbo coder block of parallelization degree n, comprising
 a) a first stoic to store n samples of an input signal to the parallel turbo coding block;
 b) a second store to store n samples of at least one output signal of the parallel turbo coding block; and
 c) a turbo coder comprising a bank of n delay units and being adapted to parallel process n samples of the input signal such that at least two delay units of the bank directly receive subsets of the n samples of the input signal and an output signal of at least one delay unit in the turbo coder is supplied to at least two delay units in the turbo coder.

3. The Parallel turbo coder block according to claim 2, wherein the turbo coder has a structure being derivable from a serial turbo coder block description according to:

$$x_1(t) = I(t-1) \oplus \alpha_1 \cdot x_1(t-1) \oplus \alpha_2 \cdot x_2(t-1) \oplus \ldots \oplus \alpha_N \cdot x_N(t-1)$$
$$\alpha_i \varepsilon \{0, 1\}$$
$$x_2(t) = x_1(t-1)$$
$$\vdots \quad \vdots$$
$$x_N(t) = x_{N-1}(t-1)$$
$$Q_j(t) = \beta_{j0} \cdot I(t-1) \oplus$$
$$x_1(t-1) \cdot [\beta_{j0} \cdot \alpha_1 \oplus \beta_{j1}] \oplus$$
$$\vdots$$
$$x_N(t-1) \cdot [\beta_{j0} \cdot \alpha_N \oplus \beta_{jN}]$$
$$\beta_{ji} \varepsilon \{0, 1\}$$
$$j \varepsilon [1, \ldots, M]$$

through the parallel turbo coder implementation method of claim 1.

4. A paralled turbo coder block according to claim 2, whecein the parallelization degree is 2, N=3, M=1, α=[0, 1, 1], β=[0, 1], and a structure of the turbo coder is $$Q0(p) = I0(p-1) \oplus I1(p-1) \oplus x_1(p-1) \oplus x_2(p-1) \oplus x_3(p-1)$$
$$Q1(p) = I1(p-1) \oplus x_1(p-1) \oplus x_2(P-1),$$

wherein $$x_1(p) = I0(p-1) \oplus x_1(P-1) \oplus x_2(P-1),$$
$$x_2(p) = I1(p-1) \oplus x_2(p-1) \oplus x_3(p-1), \text{ and}$$
$$x_3(p) = x_1(p-1).$$

5. A parallel turbo coder block according to claim 2, wherein the parallelization degree is 4, N=3, M=1, α=[0, 1, 1], β=[1, 0, 1], and a structure of the turbo coder is $$Q0(p) = I0(p-1) \oplus I1(p-1) \oplus I2(p-1) \oplus I3(p-1) \oplus x_3(p-1)$$
$$Q1(p) = I1(p-1) \oplus I2(p-1) \oplus I3(p-1) \oplus x_1(p-1) \oplus x_3(p-1)$$
$$Q2(p) = I2(p-1) \oplus I3(p-1) \oplus x_1(p-1) \oplus x_2(p-1) \oplus x_3(p-1)$$
$$Q3(p) = I3(p-1) \oplus x_1(p-1) \oplus x_2(p-1),$$

wherein $x_1(p)=I0(p-1)\oplus I2(p-1)\oplus I3(p-1)\oplus$ $x_1(p-1)\oplus x_3(p-1),$ $x_2(p)=I1(p-1)\oplus I3(p-1)\beta$ $x_1(P-1)\oplus x_2(P-1)\oplus x_3(p-1),$ and $x_3(p)=I2(p-1)\oplus x_1(p-1)\oplus x_2(P-1).$ 6. A parallel turbo coder block according to claim 2, wherein the parallelization degree is 8, N=3, M=1, α=[0, 1, 1], β=[1, 1, 0, 1], and a structure of the turbo coders is $Q0(p)=I0(p-1)\oplus I1(p-1)\oplus I2(p-1)\oplus I3(p-1)\oplus$
$I6(p-1)\oplus x_1(p-1)\oplus x_2(p-1)$ $Q1(p)=I1(p-1)\oplus I2(p-1)\oplus I3(p-1)\oplus I4(p-1)\oplus$
$I7(p-1)\oplus x_2(p-1)\oplus x_3(p-1)$ $Q2(p)=I2(p-1)\oplus I3(p-1)\oplus I4(p-1)\oplus I5(p-1)\oplus x_1(p-1)$ $Q3(p)=I3(p-1)\oplus I4(p-1)\oplus I5(p-1)\oplus I6(p-1)\oplus x_2(P-1)$ $Q4(p)=I4(p-1)\oplus I5(p-1)\oplus I6(p-1)\oplus I7(p-1)\oplus x_3(p-1)$ $Q5(p)=I5(p-1)\oplus I6(p-1)\oplus I7(p-1)\oplus x_1(p-1)\oplus x_3(p-1)$ $Q6(p)=I6(p-1)\oplus I7(p-1)\oplus x_1(p-1)\oplus x_2(p-1)\oplus x_3(p-1)$ $Q7(p)=I7(p-1)\oplus x_1(p-1)\oplus x_2(p-1),$ wherein $x_1(p)=I0(p-1)\oplus I2(p-1)\oplus I3(p-1)\oplus$
$I4(p-1)\oplus I7(p-1)\oplus x_2(p-1)\oplus x_3(p-1),$ $x_2(p)=I1(p-1)\oplus I3(p-1)\oplus I4(p-1)\oplus I5(p-1)\oplus$
$x_1(p-1),$ and $x_3(p)=I2(p-1)I4(p-1)\oplus I5(p-1)\oplus I6(p-1)\oplus x_2(p-1).$ 7. A Parallel turbo coder block according to claim 3, wherein the parallelization degree is 2, N=3, M=1, α=[0, 1, 1], β=[1, 1, 0, 1], and a structure of the turbo coder is $Q0(p)=I0(p-1)\oplus I1(p-1)\oplus x_1(p-1)\oplus x_2(p-1)\oplus x_3(p-1)$ $Q1(p)=I1(p-1)\oplus x_1(p-1)\oplus X_2(p-1),$ wherein $x_1(p)=I0(p-1)\oplus x_1(p-1)\oplus x_2(p-1),$ $x_2(p)=I1(p-1)\oplus x_2(p-1)\oplus x_3(p-1),$ and $x_3(p)=x_1(p-1).$ 8. A parallel turbo coder block according to claim 3, wherein the parallelization degree is 4, N=3, M=1, α=[0, 1, 1], β=[1, 1, 0, 1], and a structure of the turbo coder is $Q0(p)=I0(p-1)\oplus I1(p-1)\oplus I2(p-1)\oplus I3(p-1)\oplus x_3(p-1)$ $Q1(p)=I1(p-1)\oplus I2(p-1)\beta I3(p-1)\oplus x_1(p-1)\oplus x_3(p-1)$ $Q2(p)=I2(p-1)\oplus I3(p-1)\oplus x_1(p-1)\oplus x_2(p-1)\oplus x_3(p-1)$ $Q3(p)=I3(p-1)\oplus x_1(p-1)\oplus x_2(p-1)$ wherein $x_1(p)=I0(p-1)\oplus I2(p-1)\oplus I3(p-1)\oplus$ $x_1(p-1)\oplus x_3(p-1),$ $x_2(p)=I1(p-1)\oplus I3(p-1)\oplus$ $x_1(p-1)\oplus x_2(p-1)\oplus x_3(p-1),$ and $x_3(p)=I2(p-1)\oplus x_1(p-1)\oplus x_2(p-1).$ 9. A parallel turbo coder block according to claim 3, wherein the parallelization degree is 8, N=3, M=1, α=[0, 1, 1], β=[1, 1, 0, 1], and a structure of the turbo coder is $Q0(p)=I0(p-1)\oplus I1(p-1)\oplus I2(p-1)\oplus I3(p-1)\oplus I6(p-1)\oplus x_2(p-1)\oplus x_2(p-1)$ $Q1(p)=I1(p-1)\oplus I2(p-1)\oplus I3(p-1)\oplus I4(p-1)\oplus I7(p-1)\oplus x_2(p-1)\oplus x_3(p-1)$ $Q2(p)=I2(p-1)\oplus I3(p-1)\oplus I4(p-1)\oplus I5(p-1)\oplus x_1(p-1)$ $Q3(p)=I3(p-1)\oplus I4(p-1)\oplus I5(p-1)\oplus I6(p-1)\oplus x_2(p-1)$ $Q4(p)=I4(p-1)\oplus I5(p-1)\oplus I6(p-1)\oplus I7(p-1)\oplus x_3(p-1)$ $Q5(p)=I5(p-1)\oplus I6(p-1)\oplus I7(p-1)\oplus x_1(p-1)\oplus x_3(p-1)$ $Q6(p)=I6(p-1)\oplus I7(p-1)\oplus x_1(p-1)\oplus x_2(p-1)\oplus x_3(p-1)$ $Q7(p)=I7(p-1)\oplus x_1(p-1)\oplus x_2(p-1)\oplus x_3(p-1)$ wherein $x_1(p)=I0(p-1)\oplus I2(p-1)\oplus I3(p-1)\oplus I4(p-1)\oplus I7(p-1)\oplus x_2(p-1)\oplus x_3(p-1),$ $x_2(p)=I1(p-1)\oplus I3(p-1)\oplus I4(p-1)\oplus I5(p-1)\oplus x_1(p-1),$ and $x_3(p)=I2(p-1)I4(p-1)\oplus I5(p-1)\oplus I6(p-1)\oplus x_2(p-1).$ 10. A computer program product stored in a memory comprising software code portions for performing the method according to claim 1 when the product is run on a computer.

11. The computer program product according to claim 10, wherein the software code portions are of the VHDL type.

12. The computer programm product according to claim 11, wherein the software code portions are defined as follows:

```
LIBRARY ieee;
USE ieee.std_logic_1164.ALL;
USE ieee.std_logic_arith.ALL.
ENTITY en_turbo_coder_rtl IS
    PORT(
        -- General:
        reset_p     : IN STD_LOGIC;
        clk32m      : IN STD_LOGIC; -- Clock
                      (rising edge triggered)
        input_8     : IN std_logic_vector(7 DOWNTO 0);
        input_4     : IN std_logic_vector(3 DOWNTO 0);
        input_2     : IN std_logic_vector(1 DOWNTO 0);
        input_1     : IN std_logic:
        -- turboCoding 2 bit parallel
        output_8    : OUT std_logic_vector(7 DOWNTO 0);
        output_4    : OUT std_logic_vector(3 DOWNTO 0);
        output_2    : OUT std_logic_vector(1 DOWNTO 0);
        output_1    : OUT std_logic
    );
END en_turbo_coder_rtl;
ARCHITECTURE rtl OF en_turbo_coder_rtl IS
```

-continued

```
SIGNAL s1_x1           : std_logic;
SIGNAL s1_x2           : std_logic;
SIGNAL s1_x3           : std_logic;
SIGNAL s1_i            : std_logic;
SIGNAL S1_o            : std_logic;
SIGNAL s2_x1           : std_logic;
SIGNAL s2_x2           : std_logic;
SIGNAL s2_x3           : std_logic;
SIGNAL s2_i            : std_logic_vector(1 DOWNTO 0);
SIGNAL s2_o            : std_logic_vector(1 DOWNTO 0);
SIGNAL s4_x1           : std_logic;
SIGNAL s4_x2           : std_logic;
SIGNAL s4_x3           : std_logic;
SIGNAL s4_i            : std_logic_vector(3 DOWNTO 0);
SIGNAL s4_o            : std_logic_vector(3 DOWNTO 0);
SIGNAL s8_x1           : std_logic;
SIGNAL s8_x2           : std_logic;
SIGNAL s8_x3           : std_logic;
SIGNAL s8_i            : std_logic_vector(7 DOWNTO 0);
SIGNAL s8_o            : std_logic_vector(7 DOWNTO 0);
BEGIN
    tc_1: PROCESS (clk32m, reset_p) -- seriell building of TC
    BEGIN
        IF reset_p = '1' THEN
            s1_x1 <= '0';
            s1_x2 <= '0';
            s1_x3 <= '0';
            s1_i  <= '0';
            s1_o  <= '0';
        ELSIF clk32m'EVENT AND clk32m = '1' THEN
            s1_i  <= input_1;
            s1_x1 <= s1_i XOR s1_x2 XOR s1_x3;
            s1_x2 <= s1_x1;
            s1_x3 <= s1_x2;
            s1_o  <= s1_i XOR s1_x2 XOR s1_x1;
        END IF;
    END PROCESS tc_1;
    output_1 <= s1_o;
    tc_2: PROCESS (clk32m, reset_p) -- 2bit par building of TC
    BEGIN
        IF reset_p = '1' THEN
            s2_x1 <= '0';
            s2_x2 <= '0';
            s2_x3 <= '0';
            s2_i  <= (OTHERS => '0');
            s2_o  <= (OTHERS => '0');
        ELSIF clk32m'EVENT AND clk32m = '1' THEN
            s2_i  <= input_2;
            s2_x1 <= s2_i(0) XOR s2_x1 XOR s2_x2;
            s2_x2 <= s2_i(1) XOR s2_x2 XOR s2_x3;
            s2_x3 <= s2_x1;
            s2_o(0) <= s2_i(0) XOR
                s2_i(1) XOR s2_x1 XOR s2_x2 XOR s2_x3;
            s2_o(1) <= s2_i(1) XOR s2_x1 XOR s2_x2;
        END IF;
    END PROCESS tc_2;
    output_2 <= s2_o;
    tc_4: PROCESS (clk32m, reset_p) -- 4bit par building of TC
    BEGIN
        IF reset_p = '1' THEN
            s4_x1 <= '0';
            s4_x2 <= '0';
            s4_x3 <= '0';
            s4_i <= (OTHERS => '0');
            s4_o <= (OTHERS => '0');
        ELSIF clk32m'EVENT AND clk32m = '1' THEN
            s4_i  <= input_4;
            s4_x1 <= s4_i(0) XOR s4_i(2) XOR s4_i(3)
                XOR s4_x1 XOR s4_x3;
            s4_x2 <= s4_i(1) XOR s4_i(3) XOR s4_x1
                XOR s4_x2 XOR s4_x3;
            s4_x3 <= s4_i(2) XOR s4_x1 XOR s4_x2;
            s4_o(0) <= s4_i(0) XOR s4_i(1) XOR s4_i(2)
                XOR s4_i(3) XOR s4_x3;
            s4_o(1) <= s4_i(1) XOR s4_i(2) XOR s4_i(3)
                XOR s4_x1 XOR s4_x3;
            s4_o(2) <= s4_i(2) XOR s4_i(3) XOR s4_x1
                XOR s4_x2 XOR s4_x3;
            s4_o(3) <= s4_i(3) XOR s4_x1 XOR s4_x2;
        END IF;
    END PROCESS tc_4;
    output_4 <= s4_o;
    tc_8: PROCESS (clk32m, reset_p) -- 8bit par building of TC
    BEGIN
        IF reset_p = '1' THEN
            s8_x1 <= '0';
            s8_x2 <= '0';
            s8_x3 <= '0';
            s8_i <= (OTHERS => '0');
            s8_o <= (OTHERS => '0');
        ELSIF clk32m'EVENT AND clk32m = '1' THEN
            s8_i <= input_8;
            s8_x1 <= s8_i(0) XOR s8_i(2) XOR s8_i(3)
                XOR s8_i(4) XOR s8_i(7)
                XOR s8_x2 XOR s8_x3;
            s8_x2 <= s8_i(1) XOR s8_i(3) XOR s8_i(4)
                XOR s8_i(5) XOR s8_x1
            s8_x3 <= s8_i(2) XOR s8_i(4) XOR s8_i(5)
                XOR s8_i(6) XOR s8_x2;
            s8_o(0) <= s8_i(0) XOR s8_i(1) XOR s8_i(2)
                XOR s8_i(3) XOR s8_i(6)
                XOR s8_x1 XOR s8_x2;
            s8_o(1) <= s8_i(1) XOR s8_i(2) XOR s8_i(3)
                XOR s8_i(4) XOR s8_i(7)
                XOR s8_x2 XOR s8_x3;
            s8_o(2) <= s8_i(2) XOR s8_i(3) XOR s8_i(4)
                XOR s8_i(5) XOR s8_x1;
            s8_o(3) <= s8_i(3) XOR s8_i(4) XOR s8_i(5)
                XOR s8_i(6) XOR s8_x2;
            s8_o(4) <= s8_i(4) XOR s8_i(5) XOR s8_i(6)
                XOR s8_i(7) XOR s8_x3;
            s8_o(5) <= s8_i(5) XOR s8_i(6) XOR s8_i(7)
                XOR s8_x1 XOR s8_x3;
            s8_o(6) <= s8_i(6) XOR s8_i(7) XOR s8_x1
                XOR s8_x2 XOR s8_x3;
            s8_o(7) <= s8_i(7) XOR s8_x1 XOR s8_x2;
        END IF;
    END PROCESS tc_8;
    output_8 <= s8_o;
END rtl.
```

* * * * *